(12) United States Patent
Fricke et al.

(10) Patent No.: US 6,781,858 B2
(45) Date of Patent: Aug. 24, 2004

(54) CUBIC MEMORY ARRAY

(75) Inventors: Peter Fricke, Corvallis, OR (US); Andrew L. Van Brocklin, Corvallis, OR (US); Daryl Anderson, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/650,895

(22) Filed: Aug. 29, 2003

(65) Prior Publication Data

US 2004/0042313 A1 Mar. 4, 2004

Related U.S. Application Data

(63) Continuation of application No. 10/116,213, filed on Apr. 2, 2002, now Pat. No. 6,643,159.

(51) Int. Cl.[7] .............................. G11C 5/02; G11C 5/06
(52) U.S. Cl. ........................................... 365/51; 365/63
(58) Field of Search ........................... 365/51, 63, 105, 365/96

(56) References Cited

U.S. PATENT DOCUMENTS

| | | | |
|---|---|---|---|
| 3,271,591 A | | 9/1966 | Ovshinsky |
| 3,530,441 A | | 9/1970 | Ovshinsky |
| 3,641,516 A | | 2/1972 | Castrucci et al. |
| 4,287,571 A | | 9/1981 | Chakravarti et al. |
| 4,499,557 A | | 2/1985 | Holmberg et al. |
| 4,599,705 A | | 7/1986 | Holmberg et al. |
| 5,191,550 A | * | 3/1993 | Kubota ......................... 365/96 |
| 5,335,219 A | | 8/1994 | Ovshinsky et al. |
| 5,475,253 A | * | 12/1995 | Look et al. .................. 257/530 |
| 5,625,220 A | | 4/1997 | Liu et al. |
| 5,659,500 A | | 8/1997 | Mehrad |
| 5,751,012 A | | 5/1998 | Wolstenholme et al. |
| 5,821,558 A | | 10/1998 | Han et al. |

(List continued on next page.)

FOREIGN PATENT DOCUMENTS

| | | |
|---|---|---|
| EP | 0073486 | 3/1983 |
| EP | 0939444 A2 | 9/1999 |
| EP | 1265287 A2 | 12/2002 |
| GB | 1003489 | 5/1963 |

OTHER PUBLICATIONS

Victor, W.C. Chan et al "Multiple Layers of CMOS Integrated Circuites Using Recrystallized Silicon Film" IEEE Electron Device Letters, V. 22(2), Feb. 2001, pp 77–79.

Thomas H. Lee, "A Vertical Leap for Microchips," Scientific American, Jan. 2002, pp 53–59.

Esmat Hamdy et al, "Dielectric based antifuses for logic and memory ICs" IEEE International Electron Devices Meeting, IEDM 88, Aug. 1988, pp 786–789.

Chenming Hu, "Interconnect devices for field programmable gate array." IEEE International Electron Devices Meeting, IEDM 92 Apr. 1992, pp 591–594.

Jonathan Green et al, "Antifuse Field Programmable Gate Arrays", Proc IEEE vol. 81(7), Jul. 1993, pp 1042–1056.

Vivek D. Kulkarni et al, "Patterning of Submicron Metal Features and Pillars in Multil vel Metallization", J. Electochem. Soc. V.135(12), Dec. 1988, pp 3094–3098.

*Primary Examiner*—Van Thu Nguyen
*Assistant Examiner*—J. H. Hur
(74) *Attorney, Agent, or Firm*—Timothy F. Myers

(57) ABSTRACT

A cubic memory array is fabricated on a substrate having a planar surface. The cubic memory array includes a plurality of first select-lines organized in more than one plane parallel to the planar surface. A plurality of second select-lines is formed in pillars disposed orthogonal to the planer surface of the substrate. A plurality of memory cells are respectively coupled to the plurality of first and plurality of second select-lines.

67 Claims, 16 Drawing Sheets

U.S. PATENT DOCUMENTS

| | | |
|---|---|---|
| 5,835,396 A | 11/1998 | Zhang |
| 5,942,777 A | 8/1999 | Chang |
| 5,969,380 A | 10/1999 | Seyyedy |
| 6,002,607 A | 12/1999 | Dvir |
| 6,004,825 A | 12/1999 | Seyyedy |
| 6,026,017 A | 2/2000 | Wong et al. |
| 6,033,955 A | 3/2000 | Kuo et al. |
| 6,034,882 A | 3/2000 | Johnson et al. |
| 6,111,302 A | 8/2000 | Zhang et al. |
| 6,185,121 B1 | 2/2001 | O'Neill |
| 6,185,122 B1 | 2/2001 | Johnson et al. |
| 6,351,406 B1 | 2/2002 | Johnson et al. |
| 6,462,977 B2 * | 10/2002 | Butz .......................... 365/63 |
| 6,504,742 B1 | 1/2003 | Tran et al. |
| 2001/0011776 A1 | 8/2001 | Igarashi et al. |
| 2001/0055838 A1 | 12/2001 | Walker et al. |
| 2002/0041525 A1 | 4/2002 | Butz |

\* cited by examiner

CUBIC MEMORY ARRAY

This is a continuation of application Ser. No. 10/116,213 filed on Apr. 2, 2002, now U.S. Pat. No. 6,643,159.

BACKGROUND OF THE INVENTION

Personal computers, workstations, graphic subsystems of displays, electronic games and other electrical devices all include memory systems for storing data. An ever-increasing demand exists for larger and faster memory systems. Attributes of memory technologies include data access time (i.e. speed), cost, reliability, size (i.e. density), and electrical power dissipation. Several memory technologies exist such as Floppy drives, hard drives, CD/DVD drives and semiconductor memories. Semiconductor memories include DRAMS, SRAMs, ROMs, PROMs, OTPs, EEPROMs, FLASH, and VRAM memories to just name a few. While microprocessor-processing power (i.e. speed) has increase significantly in keeping with Moore's Law, the memory devices that communicate with the microprocessor have only been able to keep up with increasing density and not speed. Part of the problem with increasing the speed of memory devices is that as the density of memory cells increase within a given memory technology, capacitive delays, sense circuits and conventional memory layout organizations keep the access time improvements minimal. If the access times cannot be improved along with the density improvements made to the memory, the development of computer systems will falter. Therefore a need exists for a new memory architecture that not only increases density but data access time as well.

SUMMARY OF THE INVENTION

A cubic (3D) memory array is fabricated on a substrate having a planar surface. The cubic memory array includes a plurality of first select-lines organized in more than one plane parallel to the planar surface. A plurality of second select-lines is formed in pillars disposed orthogonal to the planer surface of the substrate. A plurality of memory cells are respectively coupled to the plurality of first and plurality of second select-lines.

BRIEF DESCRIPTION OF THE DRAWINGS

The invention is better understood with reference to the following drawings. The elements of the drawings are not necessarily to scale relative to each other. Rather, emphasis has instead been placed upon clearly illustrating the invention. Furthermore, like reference numerals designate corresponding similar parts through the several views.

DETAILED DESCRIPTION OF THE PREFERRED EMBODIMENT

Figure 1:
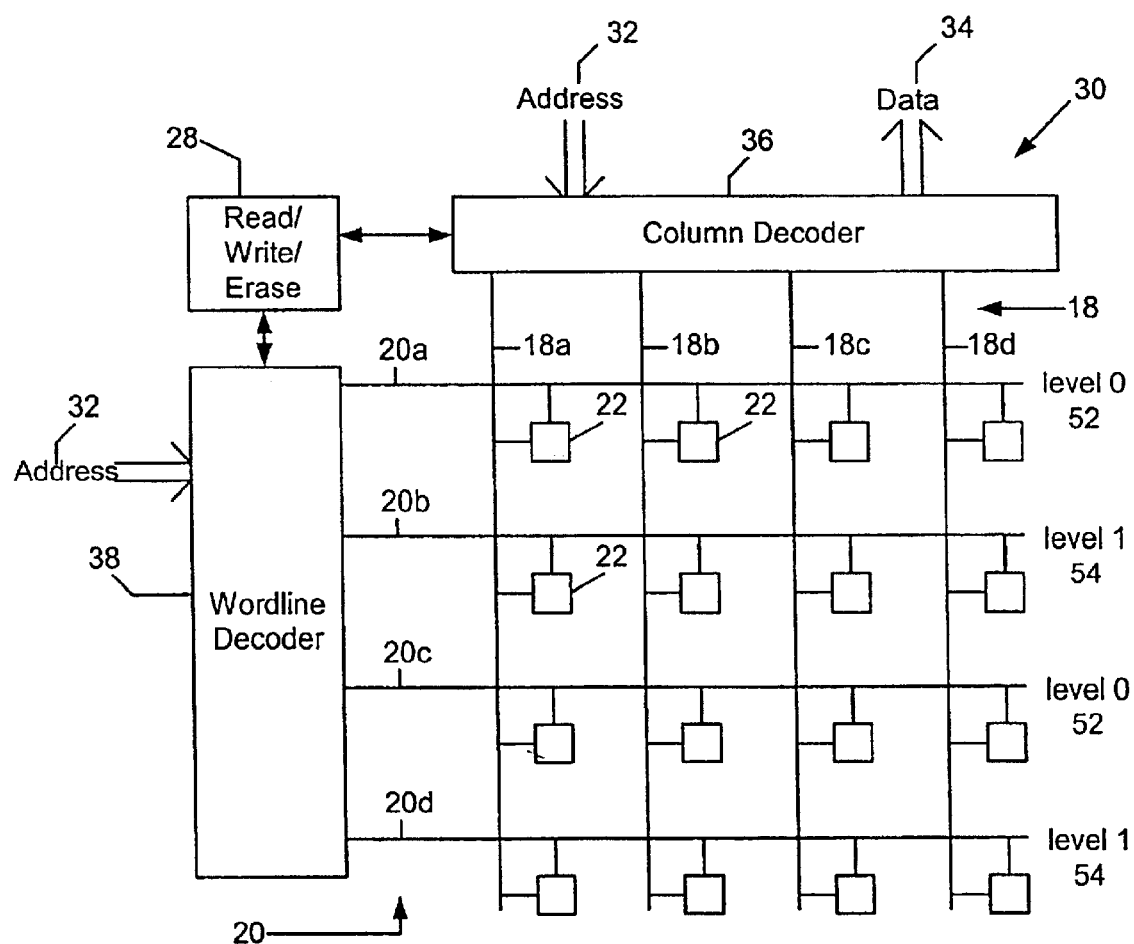
FIG. 1 is a schematic of a memory array for at least one embodiment of the invention.

The embodiments described herein of a 3D memory architecture utilize a vertical pillar to form either the row or column lines used to select a particular memory cell within an array of memory cells. This architecture creates a 'cubed' array structure out of a plurality of memory cells that is very volumetrically space efficient, faster, and easier to manufacture than previous 3D-architectures that simply expand conventional cross-point memory arrays by stacking them. One embodiment described herein involves write-once arrays, also known as one-time programmable (OTP) memory or write-once read-many (WORM) memory. When implementing write-once arrays using the vertical pillars as bit-lines (or alternatively word-lines) in a 'cubic' (i.e. having three dimensions, although not each necessarily the same length) memory array, a tunnel junction is formed on the vertical pillar at the intersection of the horizontal word-lines and the vertical bit-lines. Preferably included in the formation of the cubic memory array is a control element for each storage element that is physically adjacent to the storage element and in series with it between the horizontal word-lines and the vertical bit-lines. It should be understood by those of ordinary skill in the art that the word-lines might be made vertical and the column lines be made horizontal without departing from the scope and spirit of the invention. For purposes of clarity in describing the invention in this application, the vertical select lines will be referred to as columns or bits lines and the horizontal select lines will be referred to as word-lines or row lines. Alternatively, the horizontal select lines may be commonly referred to as drive lines and the vertical select lines as sense lines. Because the orientation of the drive and sense lines are interchangeable, there is in actuality a set of first select lines and a set of second select lines that are disposed in separate planes that are orthogonal to each other to form the cubic memory array. One of the first or second select lines form a vertical pillar with respect to the plane of the substrate on which the memory array is formed.

A memory array is fabricated on a substrate that defines a plane. The memory array includes a plurality of memory cells stacked vertically. The memory cells include a dielectric layer forming an insulating surface and a wordline disposed parallel to the plane of the substrate on the dielectric layer. The memory cell preferably has a control element surrounding the wordline and a memory storage element surrounding at least a portion of the control element. The control element has a first cross sectional area. The storage element has a second cross-sectional area. Preferably the cross sectional area of the storage element is preferably substantially smaller than the cross sectional area of the control element so that the storage element can change its state while the control element remains unaffected. Preferably the control element and the storage element are fabricated as similar types of devices, for example, tunnel junction devices. Alternatively, when a phase-change material is used for the storage element, the cross-sectional area of the storage element may be less, the same, or larger than the cross-sectional area of the control element. Preferably, the storage element cross-sectional area is less than the control element cross-sectional area in order to minimize power and increase the speed of changing the memory state. The memory cell includes a vertical pillar, substantially orthogonal to the plane of the substrate and contacting the memory storage element.

With this vertical pillar structured cubic memory array, the number of memory storage elements is only limited by the aspect ratio of semiconductor processes to vertically stack columns, control elements and state change memory elements for each pillar. One feature of this architecture is that stacking of multiple cubic arrays allows for larger arrays than that possible with conventional semiconductor processes. With this 3D-architecture of vertical pillars, up to 20 or more horizontal word-lines can be accessed per each vertical bit-line.

Further, the cubic memory array can be embedded with conventional integrated circuits such as microprocessors, graphic processors, and storage processors to name a few. For instance, a traditional CPU uses large arrays of memory for internal level 1 and level 2 cache memory. These cache memories typically consume a large area within a traditional processor layout. By using a cubic memory array that is disposed on top of the processor core computer circuits, a smaller die size in terms of area is achieved.

Conventional memory storage elements are typically implemented as parallel plate structures (or vertical capacitive wells) whose minimum area is traditionally limited by the minimum semiconductor photolithography process geometries and the need for a transistor based control FET. The 3D-architecture disclosed herein allows for the forming of memory storage elements in contact with the vertical pillars at the intersection of the horizontal and vertical select lines. This formation allows for a memory storage element that has an area determined by the height of the edge of the horizontal select lines and the width of the vertical select pillar. Therefore, the area of the memory storage element can be greatly reduced in this architecture thus allowing for faster access speeds and less energy required when performing a fusing operation for tunnel junction or dielectric rupture devices. Further, when the memory storage element is formed using a tunnel junction on the vertical edges of the horizontal and vertical select lines, the effects of defects found in conventional planar tunnel junctions is greatly reduced. By having the memory drive and sense select lines arranged in horizontal and vertical planes, respectively, the capacitance between the drive and sense select lines is reduced. This reduced capacitance allows for faster access speeds for the memory array.

A cubic memory array of memory cells is created using one of any various semiconductor devices for the storage and control elements that interface to the vertical pillars, which are used as part of the memory selection circuitry. Most implementations of the 3D-architecture will be performed using conventional semiconductor equipment and silicon substrates as starting materials. However, the semiconductor devices of the present invention are applicable to a broad range of semiconductor devices technologies and can be fabricated from a variety of semiconductor materials. The following description discusses several presently preferred embodiments of the semiconductor devices of the present invention as implemented in silicon substrates, since the majority of currently available semiconductor devices are fabricated in silicon substrates and the most commonly encountered applications of the present invention will involve silicon substrates. Nevertheless, the present invention may also advantageously be employed in gallium arsenide, germanium, and other semiconductor materials. Accordingly, the present invention is not intended to be limited to those devices fabricated in silicon semiconductor materials, but will include those devices fabricated in one or more of the available semiconductor materials and technologies available to those skilled in the art, such as thin-film-transistor (TFT) technology using polysilicon on glass substrates. Other substrates that are useful in producing the memory arrays of the invention include plastic and cellulose materials.

It should be noted that the drawings are not true to scale. Further, various parts of the active elements have not been drawn to scale. Certain dimensions have been exaggerated in relation to other dimensions in order to provide a clearer illustration and understanding of the present invention.

In addition, although the embodiments illustrated herein are sometimes shown in two-dimensional views with various regions having depth and width, it should be clearly understood that these regions are illustrations of only a portion of a device that is actually a three-dimensional structure. Accordingly, these regions will have three dimensions, including length, width, and depth, when fabricated on an actual device. Moreover, while the present invention is illustrated by preferred embodiments directed to active devices, it is not intended that these illustrations be a limitation on the scope or applicability of the present invention. It is not intended that the active devices of the present invention be limited to the physical structures illustrated. These structures are included to demonstrate the utility and application of the present invention to presently preferred embodiments.

FIG. 1 is a schematic diagram of a memory circuit 30 in which a plurality of memory cells 22 are formed in an array shown here as an exemplary two dimensional 4×4 layout. Each memory cell 22 is connected to one of a set of word-lines 20 (20a–20d) shown as rows and one of a set of bit-lines 18 (18a–18d) shown as columns. The memory circuit 30 is connected to a set of external address lines 32 and data lines 34. The address lines 32 contain a location in an encoded form (preferably binary) for selecting a particular memory cell 22 in the array of memory cells to address. The wordline decoder 38 interprets some of the address lines to decide which row or wordline the particularly selected memory cell 22 is located. Typically, only one wordline is selected and driven to a predetermined voltage level and the other wordlines are typically driven to a ground level. The address lines 32 are also used by column decoder 36 to select a particular bit-line from bit-lines 18 to interface and decode the selected particular memory cell to at least one of data lines 34 by sensing the state of the selected memory cell. The memory circuit 30 also includes read/write/erase circuitry 28 that is connected to the wordline decoder 38 and the column decoder 36 to provide the appropriate voltages and timing to the selected and deselected memory cells 22 during each operation. It should be noted that the erase operation might not be present on all types of memory circuits 30.

FIG. 1 also illustrates one exemplary organization of the array of memory cells 22 to form an embodiment of a cubic memory array. In this example, two levels (or alternatively two planes) of memory cells 22 are formed, one upon the other. The memory cells of each level are preferably substantially aligned with memory cells in the adjacent level. Level 0 (52) includes word-lines 20a and 20c. Level 1 (54) includes word lines 20b and 20d. Level 0 (52) and level 1 (54) are formed into respective planes that are substantially parallel to a substrate surface. Bit lines 18 (18a–18d) are formed in another plane that is orthogonal to the planes of the wordlines and the substrate. Thus each of the bit lines 18 forms a 'vertical' pillar with respect to a 'horizontal' substrate. The orientation chosen is for convenience in describing the invention and the actual orientation of an embodiment is arbitrary. Other arrangements for selecting the organization of the word-lines and column bitlines into a cubic array exist and still meet the spirit and scope of the invention.

Figure 2:
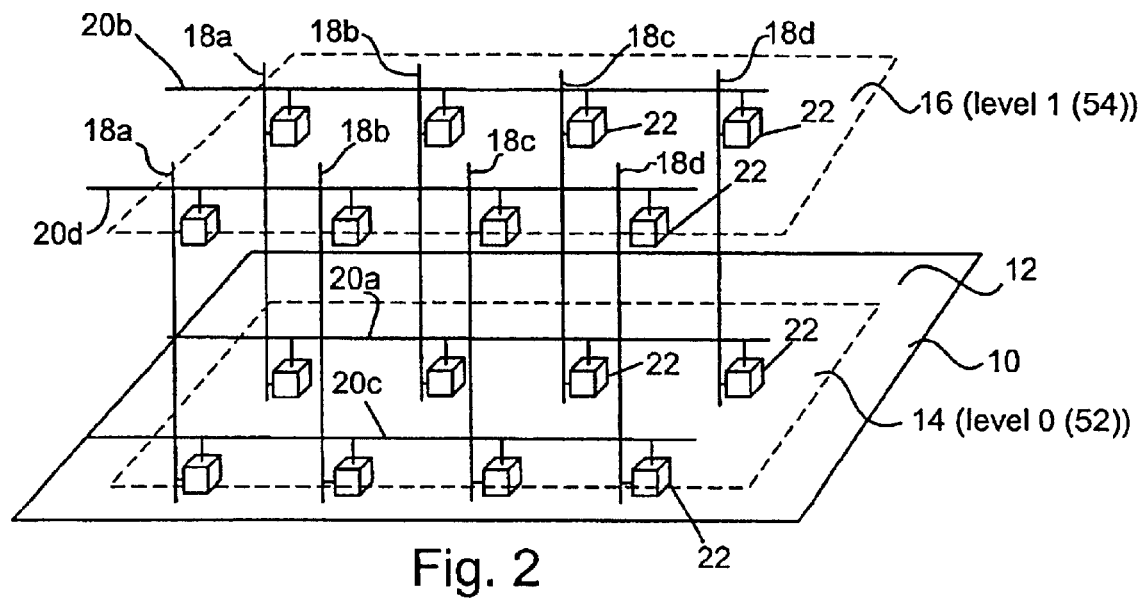
FIG. 2 is a schematic diagram of the physical layout of a memory array in one embodiment of the invention.

For example, FIG. 2 is an exemplary physical layout of the cubic memory array of FIG. 1 that incorporates the invention. Here a substrate 10, such as a silicon substrate, forms a planar surface 12 in which there may be incorporated control circuitry such as column decoder 36, wordline decoder 38, and read/write/erase circuitry 28 of FIG. 1. Disposed on the planar surface 12 of substrate 10 is a first memory plane 14 (such as level 0 (52)) formed of an array of memory cells 22. The first memory plane 14 has rows of memory cells 22 that are connected by word-lines 20 as shown. Disposed on the first memory plane 14 is a second memory plane 16 (such as level 1 (54)) of memory cells 22 that are preferably substantially aligned with the memory cells 22 of the first memory plane 14. The two memory planes 14, 16 are interconnected using vertical bit-lines 18 as shown thereby forming a cubic array of memory. A cubic array for the purposes of this disclosure is defined as "having three dimensions." The length of each actual dimension of the array may be different quantities and an actual cube of three equal lengths may not be formed. However, "cubic" is used herein in its alternative meaning of "having three dimensions" to refer to the basic box like structure of the memory array. Actual dimension lengths will vary depending on a designer's choice of the number of memory cells per plane and the number of planes to be stacked.

By using vertical pillars for at least one of the select lines used to address a memory cell 22, the memory cells 22 can be stacked closer together to increase volumetric efficiency. Further, by taking advantage of the steps used to create the cubic memory array, simplified memory cells 22 can be formed. The memory cells 22 include at least one storage element, usually configurable in an on or off state, or containing charge that represents an on or off state. Alternatively, memory cells 22 may also store multiple states or charges that represent multiple states so that more than one bit of information is stored per memory cell 22.

Figure 3:
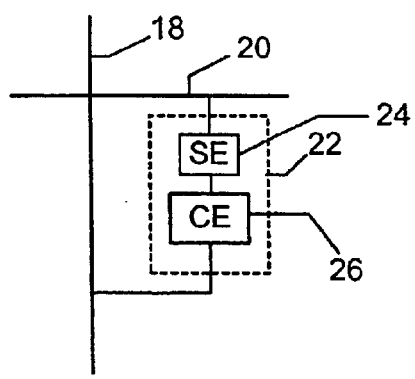
FIG. 3 is a diagram showing an exemplary memory cell used in the memory array of FIG. 2.

FIG. 3 is a block diagram of a representative memory cell 22. The memory cell 22 includes a storage element 24 and a control element 26 in series between wordline 20 and bitline 18. In this embodiment, preferably storage element 24 is an antifuse device, such as a programmable tunnel junction device. The antifuse device preferably is either a dielectric rupture type device or a tunnel junction device. However, the storage element 24 can be any device that stores a memory state that can be read out as a changed value in resistance, but preferably a tunnel junction device. The tunnel junction can be formed from oxidized metal, thermally grown oxide, or deposited oxides or nitrides. The storage element may also be optionally embodied with semiconductor materials such as polysilicon, polycrystalline, amorphous, microcrystalline, metal filament electro migration, trap induced hysterisis, ferroelectric capacitor, Hall effect, and polysilicon resistors. Other embodiments of the storage element include tunneling magneto-resistive, phase-change materials or capacitive elements such as floating gates.

Preferably control element 26 is a current steering device that exhibits non-linear behavior between voltage applied across it and the current flowing through it. Alternatively, the control element 26 can have linear behavior such as when implemented using a resistor. Preferably control element 26 is formed of a tunnel junction device or pn, pin, or Schottky diodes. Other diodes that can be used include Zener diodes, avalanche diodes, tunnel diodes, and a four layer diode such as an silicon controlled rectifier. Alternatively, the control element can be junction field effect or bipolar transistors. The control element 26 is sized sufficiently to carry an adequate current such that the state of storage element 24 can be changed. Preferably, this sizing is achieved by having the cross sectional area of the control element 26 be larger than the cross sectional area of the storage element 24. The control element 26 and the storage element 24 are preferably of the same device type, for example tunnel junction devices, but optionally, different device types can be used, such as diodes and tunnel junction devices, respectively for the control and storage elements. When the control element 26 is a diode, it is preferably formed using doped polysilicon, amorphous silicon, or microcrystalline silicon. Therefore, the control element alternatively is selected from a group of options including: a recrystallized semiconductor, an amorphous semiconductor, a polycrystalline semiconductor, a junction field effect transistor, a junction field effect transistor with its gate connected to its source or drain, an insulated gate field effect transistor with its gate connected to its source or drain, a four-layer diode, an NPN transistor, and a PNP transistor.

Figure 4:
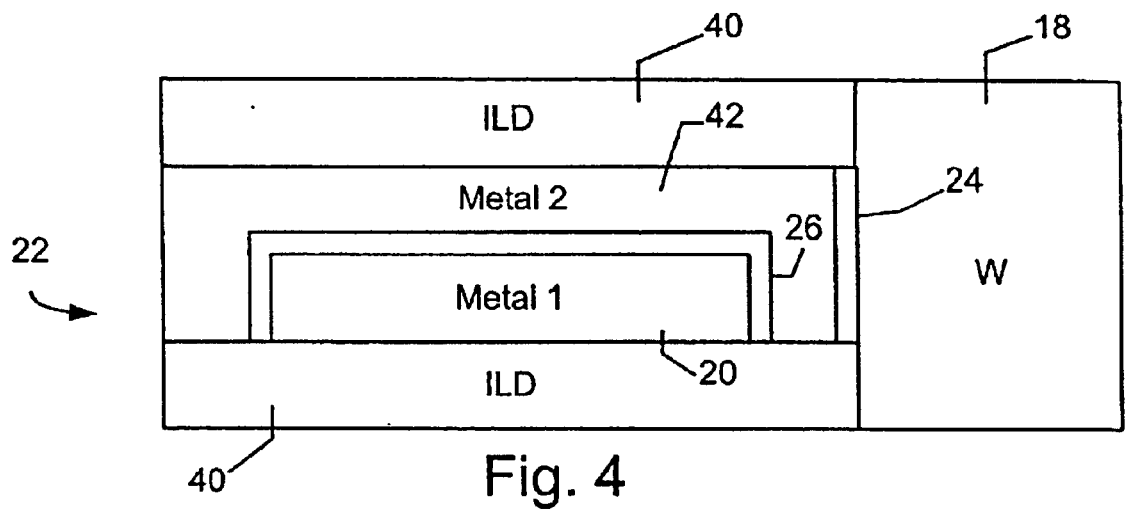
FIG. 4 is an exemplary embodiment of the memory cell shown in FIG. 3.
Figure 5:
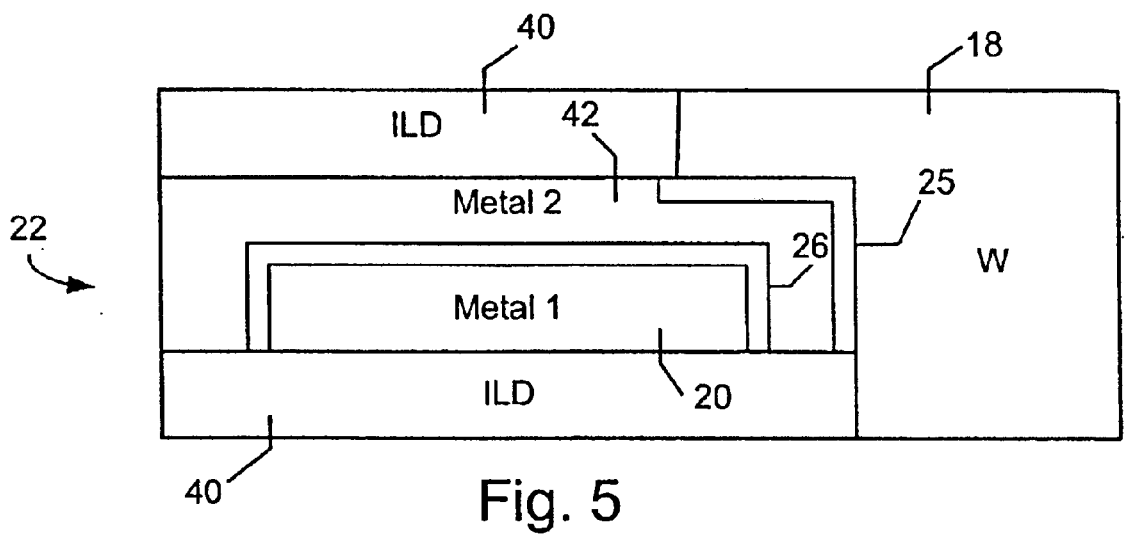
FIG. 5 is another exemplary embodiment of the memory cell shown in FIG. 3.
Figure 6:
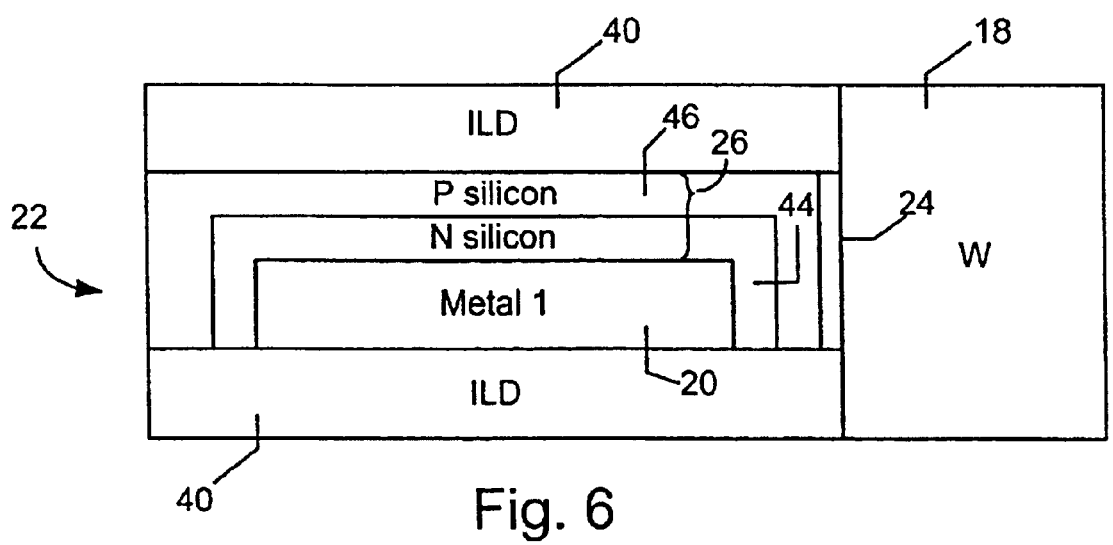
FIG. 6 is another exemplary embodiment of the memory cell shown in FIG. 3.

For example, FIGS. 4–6 are illustrations of just a few possible embodiments allowing for fabrication of a memory cell 22 used in a cubic memory array.

For instance, FIG. 4 illustrates a first embodiment of a memory cell 22 that shows bit-line 18 as a column of material made of preferably tungsten (W) that will preferably be deposited after the control element 26 and storage element 24 are formed. This bit-line 18 is disposed next to an insulating layer of dielectric material (ILD) 40.

Various materials can be used for ILD 40 and include silicon dioxide, silicon nitride, oxynitrides, and tetraethylorthosilicate (TEOS) to just name a few. The ILD can be deposited using several different conventional technologies such as chemical vapor deposition (CVD), atmospheric pressure CVD, low pressure CVD, plasma enhanced CVD, physical vapor deposition (PVD), and sputtering. The ILD can be planarized using conventional processes such as chemical mechanical polishing (CMP). ILD 40 is used throughout this specification to indicate dielectric filler material on one or more layers. The actual dielectric material may be composed of one or more of the aforementioned materials.

Disposed on the ILD 40 is a wordline 20 preferably formed of a conductive thin-film shown as metal 1, for instance, aluminum. The wordline 20 is oxidized, either self-oxidized, thermally grown, or has a deposited oxide. The oxide is preferably formed over the entire exposed portion of the wordline 20, preferably over its entire length. Preferably, the thickness of the oxide is less than 100 Angstroms and more preferably less than 50 Angstroms. Over a portion of the oxide, another conductive thin-film, shown as metal 2 (preferably aluminum), is deposited and patterned to form control element 26, a tunnel junction device with metal 1 and metal 2 as its electrodes. Metal 2 is also called a middle electrode 42 as it is formed electrically between the wordline 20 and the bitline 18. Disposed on metal 2 and portions of the oxide where the middle electrode 42 is not present is another layer of ILD 40. A via is etched in ILD 40 to locate the vertical pillar. A portion of the middle electrode 42 is preferably oxidized or oxide is deposited thereon to form the storage element 24. Finally, the tungsten is deposited to form the bitline 18 and it contacts the oxide to form the storage element 24 with the middle electrode 42 and the bitline 18 as the electrodes.

Preferably the metal 1 (20) has an oxide layer (alumina ($Al_2O_3$) in the case of an aluminum (Al) conductor) that is fabricated directly on the top exposed surface of the entire metal 1. Optionally, the metal 1 (20) and metal 2 (42) are formed of aluminum, copper, or silicide and alloys thereof although other conductive metals or semiconductors can be used. The oxide layer interfacing with metal 1 and metal 2 forms the control element 26. Preferably, the fabrication of the oxide layer is performed after metal 1 has been etched to allow for coverage over the sidewalls. A tunnel junction control element is typically formed by a metal/oxide/metal interface and for some embodiments may be the preferred control element.

When formed using an oxide layer, the storage element 24 preferably utilizes electron tunneling or alternatively dielectric rupture dynamics. Most preferably, the electron tunneling is direct tunneling thereby requiring that the oxide layer thickness be minimal, such as about 5 to about 50 Angstroms. Such a storage element 24 creates an anti-fuse structure with preferable current/voltage characteristics. At a low voltage potential across the oxide layer, such as during reading of the memory cell, the current is in the low microampere or nanoampere range and is thus efficient for power. When the anti-fuse is programmed by creating filaments through the oxide, the current is in the microampere or low milliamp range. This change in current levels creates a very good signal to noise ratio for sensing whether the oxide is programmed as a logical 0 or 1 state. While these current ranges are examples for 0.18 micron geometry that can be achieve currently, the actual current levels will vary depending on the actual process geometry used. At higher voltage potentials, such as during programming, the oxide layer begins to have higher current flows due to the tunneling current. This tunneling current creates a flow of electrons that locally heats the storage element 24, the oxide, and forms the conductive filaments through the oxide. When sufficient energy is forced across the oxide barrier to sufficiently heat the fusing site, a conducting filament is formed through the oxide and the state of the oxide is changed permanently for a one-time programmable structure. Optionally, the oxide layer can be processed to be a dielectric breakdown device rather than a tunnel junction device.

Alternative state-change technologies can be used for storage element 24. For example, the storage element 24 can be either a read only LeComber or silicide switch, or a read/writeable phase-change material. One method of forming a LeComber switch is to deposit a thin layer of amorphous intrinsic silicon on metal 1, (in this example, metal 1 is preferably a layer of Chromium (Cr)). Then a separate metal, such as gold (Ag) is deposited on the amorphous intrinsic silicon. Before programming, the LeComber switch acts as a reversed biased tunnel diode. Creating an enhanced concentrated electric field through the amorphous silicon with the invention will cause a conductive path to form or allow for hopping conduction, thus creating the anti-fuse.

One preferable phase-change material for a read/writeable (or write/erase/write) state-change element is germanium telluride (GeTe), which can be reversibly changed from a semiconducting (amorphous) to a metallic (crystalline) state by heating and cooling it at a proper rate. For example, if the GeTe is doped so that it is p-type when in its semiconducting state and is deposited on top of an n-type semiconductor-layer, then a large contrast will be seen in the number of carriers swept across the junction if the GeTe is changed to its metallic state. By using GeTe or equivalent phase-change material, the memory cell is capable of being read-writeable, e.g. being capable of writing, erasing, writing many times. This function increases the utility of the memory cell structure for some applications. Other phase-change materials can be substituted for GeTe and still meet the spirit and scope of the invention. Some examples of other preferable phase-change materials are chalcogenide alloys such as: GaSb, InSb, InSe, $Sb_2Te_3$, $Ge_2Sb_2Te_5$, InSbTe, GaSeTe, $SnSb_2Te_4$, InSbGe, AgInSbTe, (GeSn)SbTe, GeSb(SeTe), $Te_{81}Ge_{15}Sb_2S_2$ and GeSbTe.

Other antifuse structures are possible such as silicide switches. Silicide switches are formed with alternatively stacked silicon and transition metal thin films that change resistance when programmed. Generally, the programming process for a silicide antifuse is irreversible. Before writing, the stack of transaction metal and silicon layers has a first resistance. Appropriate row and column lines are selected to force a current through a selected memory cell. The current passing through the selected memory cell creates Joule heat that triggers and completes the silicidation reaction. By using the concentrated electric field created by the invention, current is focused and thus the Joule heat is concentrated in a smaller area thereby allowing the programming to be completed in less time than without the invention. The silicidation reaction causes the resistance of the selected memory cell to change to a much lower value. To read the programmed memory cell, a small sense current is supplied to a selected memory cell and the voltage drop across the selected memory cell is sensed. Some preferable silicide compounds are $Ni_2Si$, NiSi, $NiSi_2$, $Pd_2Si$, PdSi, and $Pt_2Si$, and PtSi. Other possible transition metals in various compounds with silicon include Ti, V, Cr, Mn, Fe, Co, Zr, Nb, Mo, Rh, Hf, Ta, W, and Ir.

FIG. 5 is an alternative embodiment of that shown in FIG. 4 but which includes an angled storage element 25 that surrounds at least two edges of middle electrode 42. By surrounding at least two edges of middle electrode 42 an enhanced electric field is formed at the intersection of the two edges. When shorting an antifuse, such as with tunnel junction or dielectric breakdown devices used for angled storage element 25, this enhanced electric field allows for a lower programming voltage or lower current for reduced total power, and for a faster programming time. In this embodiment, an ILD 40 is placed down on a surface adjacent and abutting the bit-line 18, preferably made of tungsten (W). When the bit-line 18 is deposited, it forms a contact surface over the angled storage element 25. By having an angled storage element, the electric field produced when a voltage is applied between the middle electrode 42 and the bitline 18 is enhanced, thereby allowing for lower power requirements in the form a lower programming voltage, lower programming current, or combination thereof. Also, the enhanced electric field provides for faster programming speed. Otherwise, the construction of the memory cell in FIG. 5 is similar to that described for FIG. 4.

FIG. 6 is another embodiment of the memory cell 22 in which the control element 26 is formed of a pn junction diode. In this embodiment, an ILD 40 is placed on a surface and a first metal, such as aluminum, is deposited and patterned to create the wordline 20. A layer of n silicon 44 is then deposited over the wordline 20. A subsequent layer of p silicon 46 is then deposited over the n silicon 44. The combined silicon is then patterned and etched to create the control element 26. An ILD 40 is then deposited or otherwise applied on the layer of p silicon 46. A via is etched in ILD 40 to locate the vertical bitline 18. The edge of the layer of p-silicon 46 that interfaces with the vertical bitline 18 is oxidized to create a silicon dioxide layer for storage element 24 preferably less than 100 Angstroms in thickness and more preferably less than 50 angstroms in thickness. The vertical bitline 18 is then deposited. The storage element 24 has the layer of p silicon 46 and the bitline 18 as electrodes and the oxide layer as the antifusible material.

Figure 7:
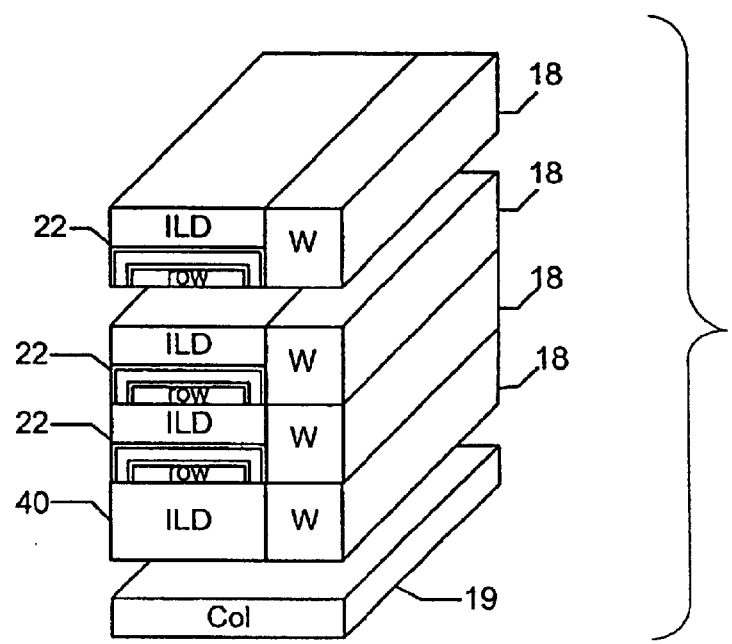
FIG. 7 is a partially exploded view of an embodiment of the invention for one vertical pillar column and multiple row lines.

FIG. 7 is an exploded view of one vertical bit-line and three horizontal wordlines for one embodiment of the invention illustrating how a vertical bit-line interfaces to conventional planar select lines. In this embodiment, a traditional horizontal column select line 19 is disposed parallel to the surface on some substrate of material, such as a conventional processed semiconductor wafer. An interface layer of ILD 40 is deposited on the horizontal column select line 19. A vertical bitline 18 is formed next to the ILD 40 and contacts the horizontal column select line 19. Then a memory cell 22, such as any of those shown in FIGS. 4–6 or other possible implementations, is disposed on the ILD 40. A vertical bitline 18 is then formed on the previous vertical bitline 18 to create the vertical pillar. Second and third memory cells 22 are deposited on the previous memory cell 22 and the vertical bit-lines 18 are deposited on the previous vertical bit-line 18 to extend the vertical pillar.

Figure 8:
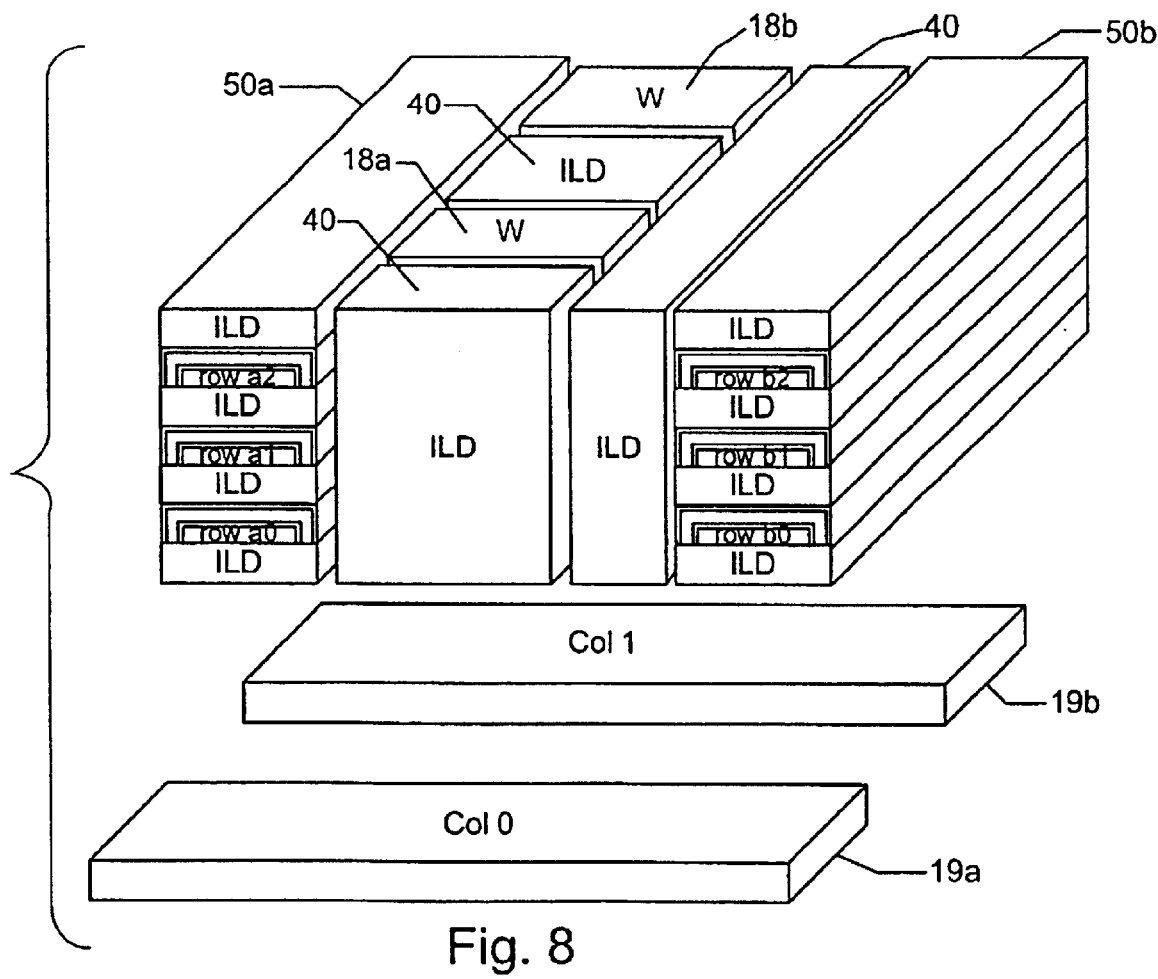
FIG. 8 is a partially exploded view of an exemplary embodiment of the invention.
Figure 9:
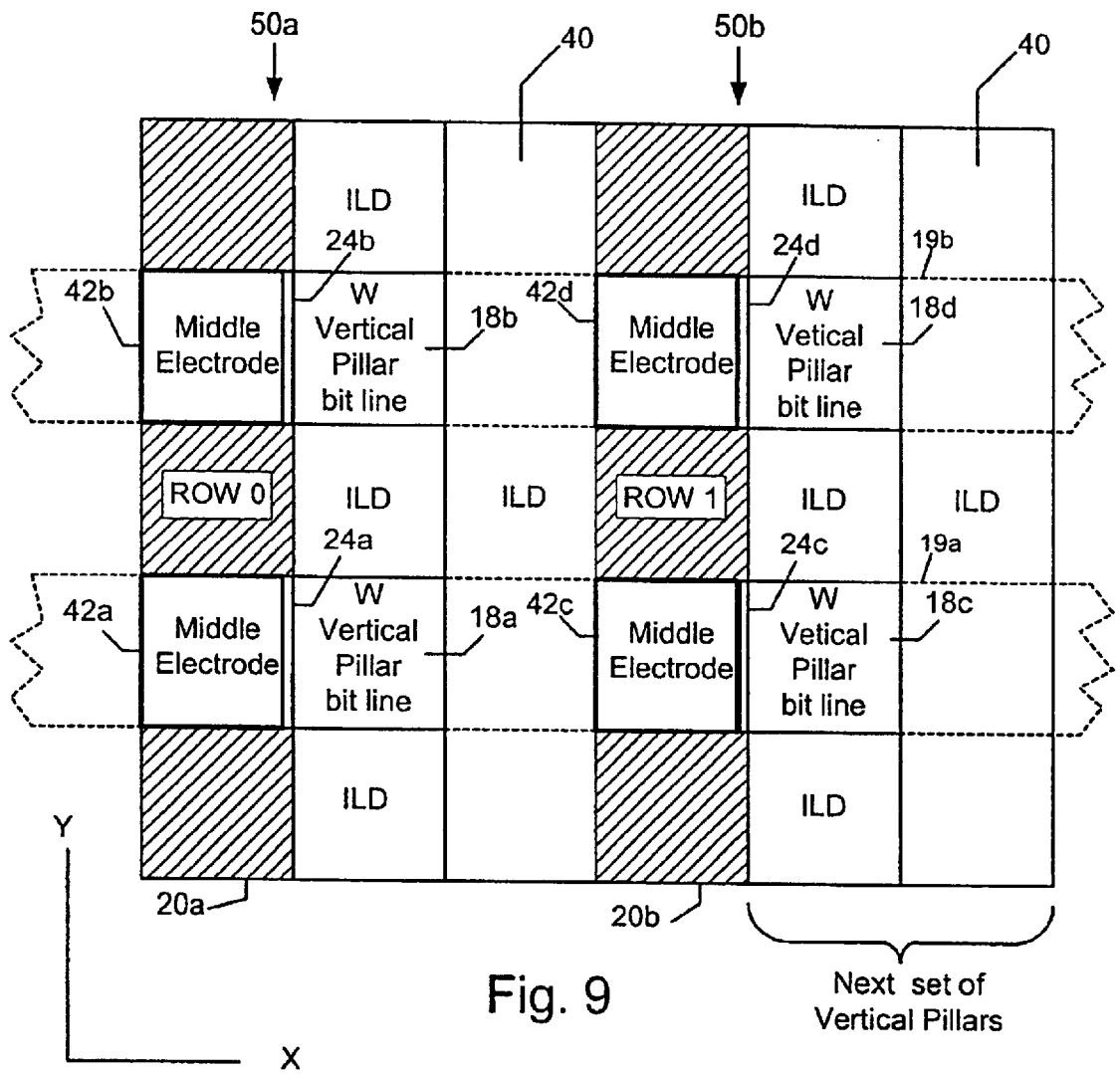
FIG. 9 is a top view of the exemplary embodiment shown in FIG. 8.

FIGS. 8 and 9 demonstrate how the cubic array of memory is expanded as desired to increase the number of memory storage elements. FIG. 8 is a partially exploded view of the components and layers of the cubic memory array. FIG. 9 is a top view of the array shown in FIG. 8. In FIG. 8, a substrate surface includes one or more horizontal bit lines such as 19a and 19b, here representing column 0 and column 2 of a memory array. On the horizontal bit lines 19a and 19b is one or more sets of memory cells, such as 50a and 50b. The various horizontal row lines are insulated from contact with adjacent horizontal row lines by various layers of ILD 40. The vertical bit-lines 18a and 18b are positioned, deposited on, and make contact to the respective horizontal bits lines 19a and 19b. An ILD 40 dielectric layer also separates the adjacent vertical bit-lines 18a and 18b. The vertical bit-lines 18a–18d make contact to the oxide layer formed on middle electrodes 42a–d (see FIG. 9). The middle electrodes are separated from the horizontal row lines 20a–b (FIG. 9) by a control element, preferably a tunnel junction device or diode in memory cell 22.

FIG. 9 also shows how an additional set of vertical pillar select lines is placed adjacent to the second set of memory cells 50b to continue to extend the array. Adjacent to the additional set of vertical pillars is another ILD 40 to provide isolation for another set of memory cells.

Figure 10:
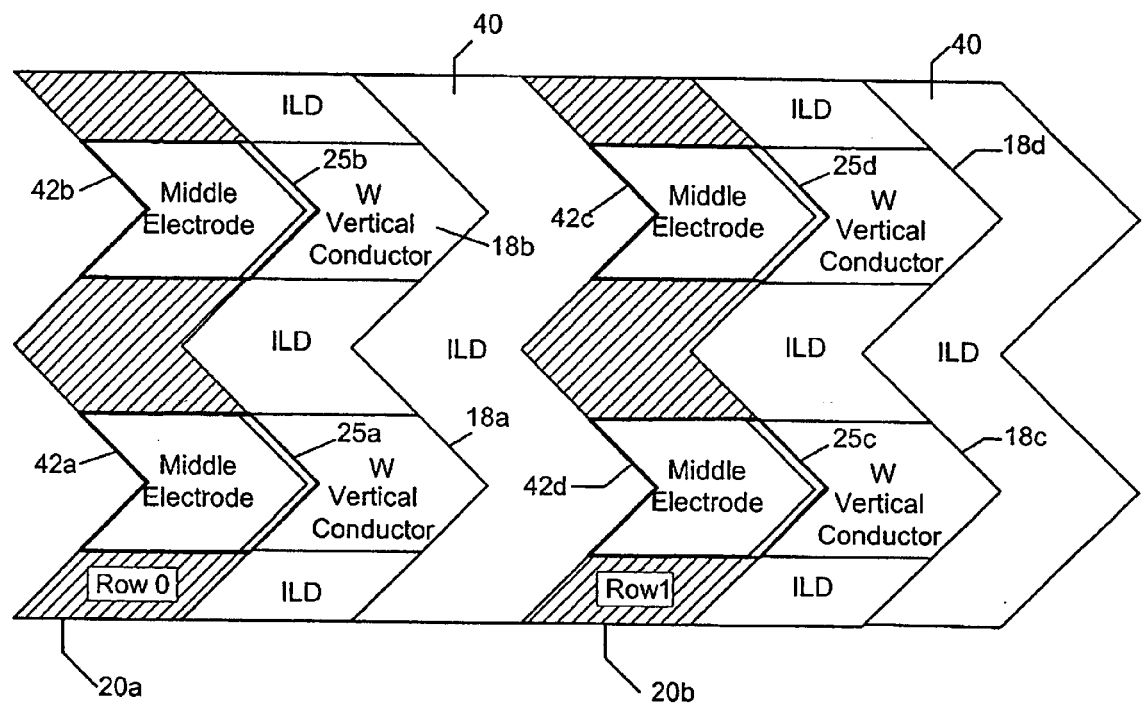
FIG. 10 is an exemplary top view of an alternative embodiment of the invention using a serpentine layout.

FIG. 10 is an alternative embodiment of the cubic memory array in which the horizontal word-lines 20a and 20b are formed in a serpentine manner to create angled storage elements 25a–d. These angles in the serpentine row lines create enhanced electrical fields to lower the programming power, voltage, current, and time required to program the angled storage elements 25a–d.

Figure 11:
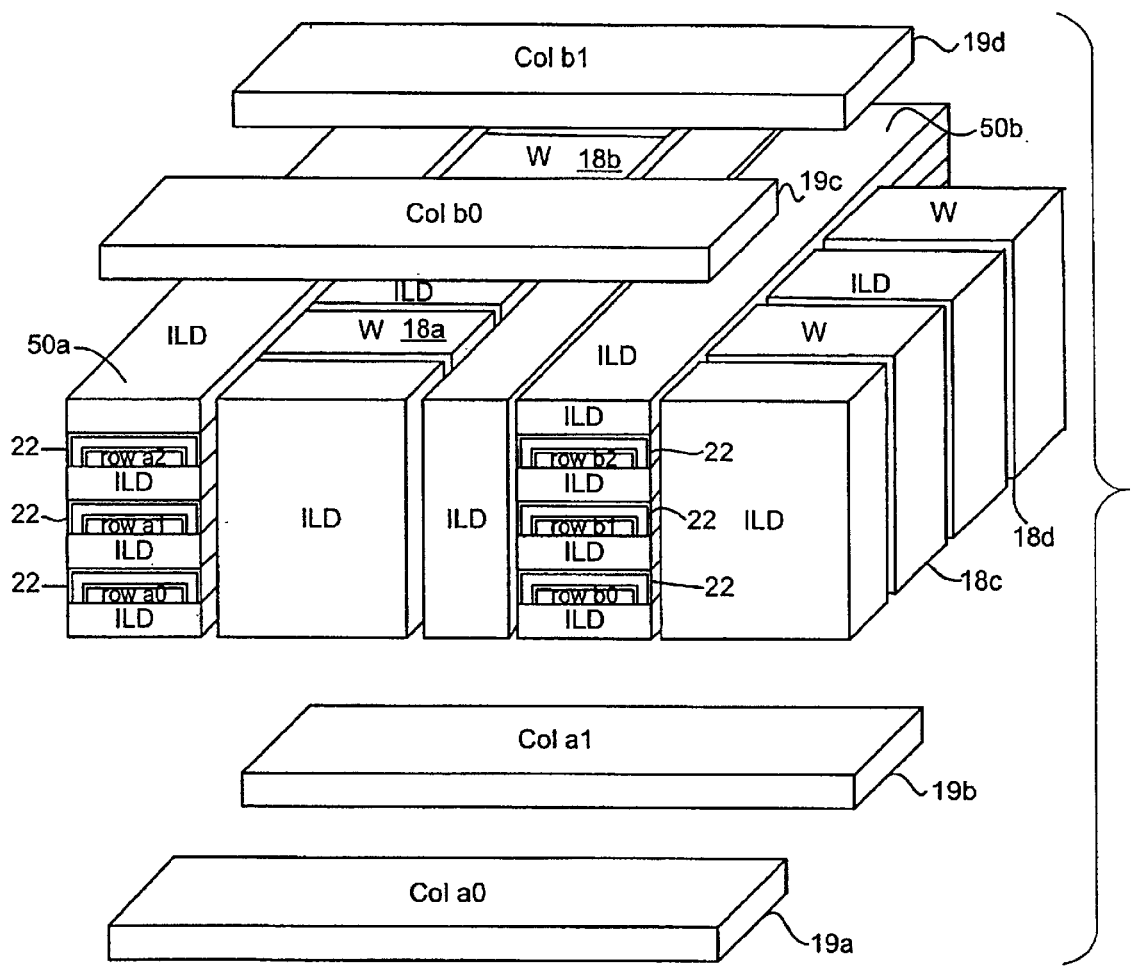
FIG. 11 is a partially exploded view of an alternative embodiment of the invention.

FIG. 11 is a partially exploded view of an alternative embodiment of the invention. In this embodiment, a first set of memory cells 50a form an intersection with vertical pillars bit-lines 18a and 18b. A second set of memory cells 50b is isolated from the first set of memory cells 50a and vertical pillars 18a and 18b by an optional interlayer dielectric (ILD). The second set of memory cells 50b form an intersection with vertical pillar bit lines 18c and 18d. Vertical pillar bit-lines 18a and 18c make electrical contact with horizontal bit-line 19a. Vertical pillar bit-lines 18b and 18d make electrical contact with horizontal bit-line 19b. Illustrated in this figure, there are three levels of memory cells 22 stacked upon one another vertically. Depending on the particular fabrication processes used, it may be difficult to keep extending the vertically stacked layers of memory cells 22 due to non-planarity of the previously fabricated surface. Therefore, one approach to allowing for additional height is to create a layer of ILD (not shown) on top of the formed layers of memory cells. This layer of ILD is then planarized such as with CMP or other known planarization techniques to form a new planar substrate on which horizontal bit-lines 19c and 19d are disposed. Further processing of adding additional sets of memory cells on the horizontal bit-lines 19c–d allows for extending the vertical dimension of the cubic memory array.

Figure 12:
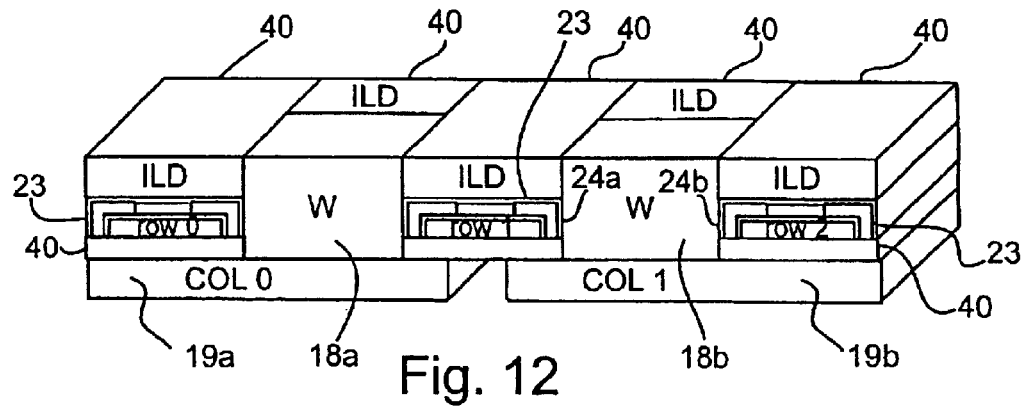
FIG. 12 is a perspective view of an alternative embodiment of the invention.

FIG. 12 is a perspective view of an alternative embodiment of the invention which increases volumetric efficiency when using antifuse storage elements by eliminating the spacer ILD 40 used to separate the next adjacent horizontal word-lines from the present set of vertical pillar bit-lines. In this embodiment, a dual memory cell 23 is disposed directly between two vertical pillar bit-lines 18a, 18b forming storage elements 24a and 24b, respectively. Although two storage elements are formed, only one storage element is actually used in a memory array. The other storage element is left unprogrammed (open circuited for an antifuse) and only provides an additional capacitive load. Thus more than one storage element contacts the vertical pillar on a particular level, however; only one storage element is actually used.

Figure 13:
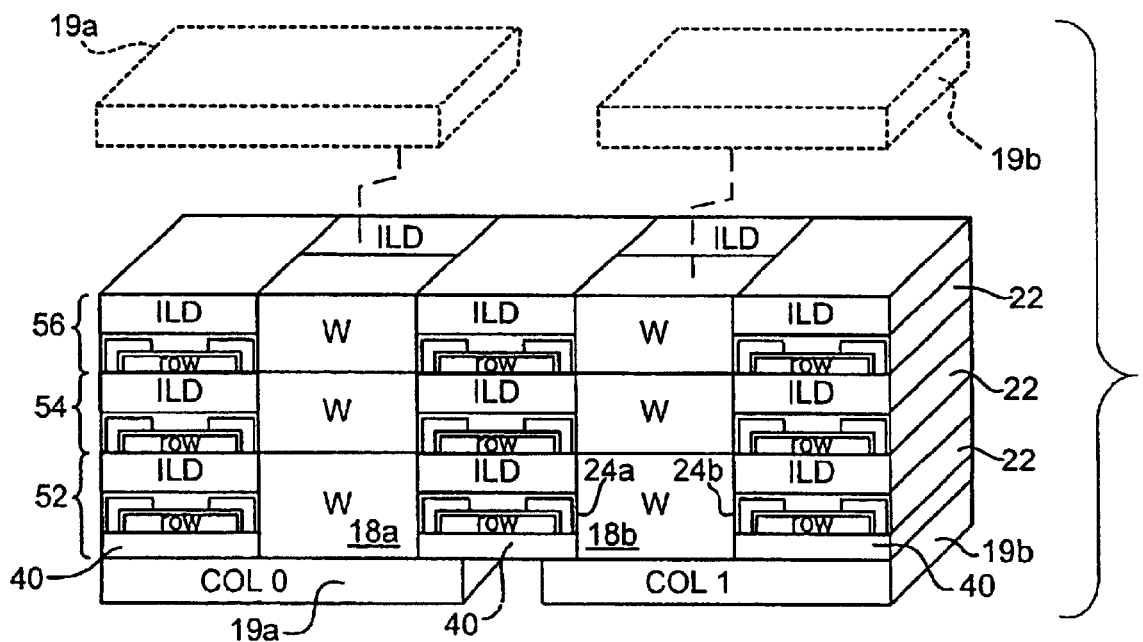
FIG. 13 is a perspective view of the embodiment shown in FIG. 12 having multiple layers of memory cells.

FIG. 13 is a perspective view of a stacked implementation of the alternative embodiment shown in FIG. 12. In this embodiment, a first level 52 is disposed on a horizontal bit-lines 19a and 19b. Optionally depending on the process used, the first level 52 can be disposed on the surface of the substrate and the horizontal bit lines 19a and 19b (shown as dashed figures) can be attached to the top of the vertical pillars 18a and 18b, respectively. The vertical pillar bit-lines 18a are 18b are electrically coupled to and contact the horizontal bit-lines 19a, 19b, respectively. A second level of memory cells 54 is disposed on the first level of memory cells 52. A third level of memory cells 56 is disposed on the second level of memory cells 54. The vertical pillars 18a and 18b are preferably formed using tungsten (W) although other metal conductors can be used. Storage elements 24a and 24b are shown contacting a single vertical pillar, thus sharing the column select signal.

Figure 14:
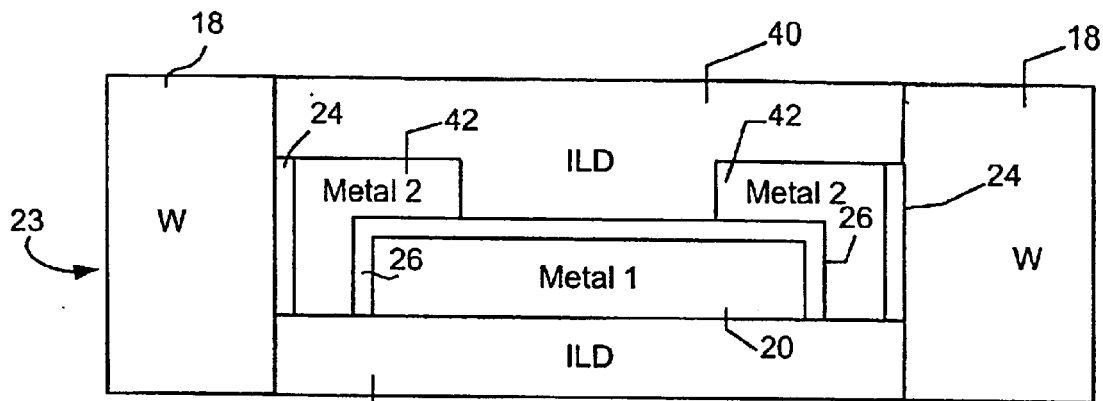
FIG. 14 is an exemplary embodiment of a set of dual memory cells.
Figure 15:
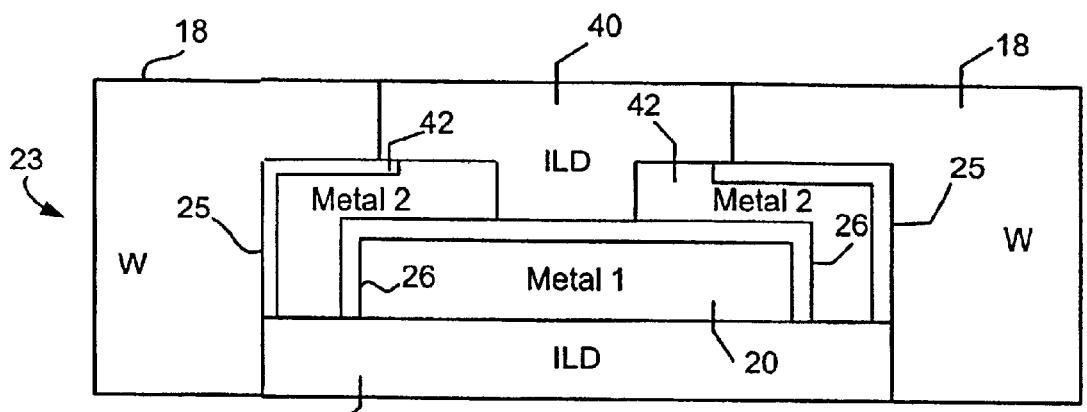
FIG. 15 is another exemplary embodiment of a set of dual memory cells.
Figure 16:
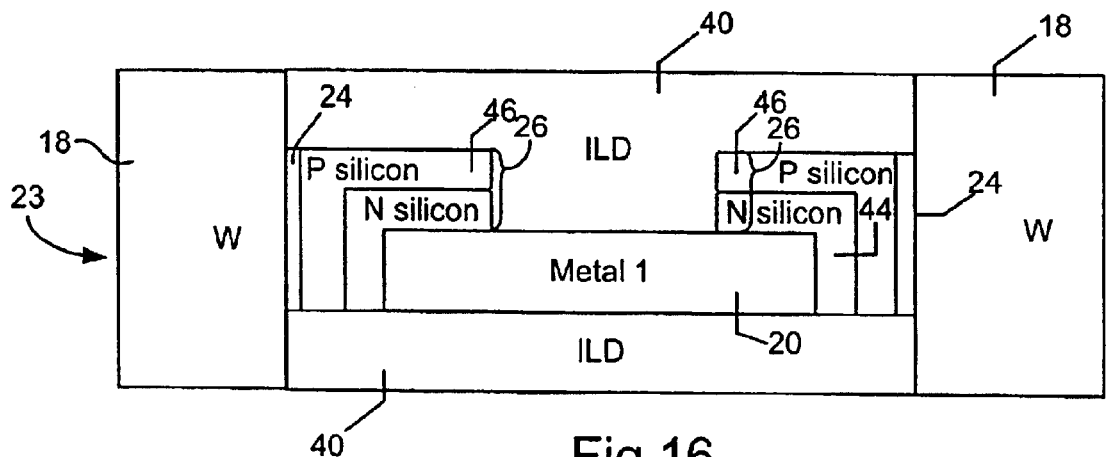
FIG. 16 is another exemplary embodiment of a set of dual memory cells.

FIGS. 14–16 are exemplary embodiments of a dual memory cell 23 used when the vertical pillars contact more than one memory cell per layer.

For instance, FIG. 14 illustrates a first embodiment of a dual memory cell 23 that shows bit-line 18 as a column of material made of preferably tungsten (W) that will preferably be deposited after the control element 26 and storage element 24 are formed. This bit-line 18 is disposed next to an insulating layer of dielectric material (ILD) 40.

Various materials can be used for ILD 40 and include silicon dioxide, silicon nitride, oxynitrides, and tetraethylorthosilicate (TEOS) to just name a few. The ILD can be deposited using several different conventional technologies such as chemical vapor deposition (CVD), atmospheric pressure CVD, low pressure CVD, plasma enhanced CVD, physical vapor deposition (PVD), and sputtering. The ILD can be planarized using conventional processes such as chemical mechanical polishing (CMP). ILD 40 is used throughout this specification to indicate dielectric filler material on one or more layers. The actual dielectric material may be composed of one or more of the aforementioned materials.

Disposed on the ILD 40 is a wordline 20 preferably formed of a conductive thin-film shown as metal 1, for instance, aluminum. The wordline 20 is oxidized, either self-oxidized, thermally grown, or deposited. The oxide is preferably formed over the entire exposed portion of the wordline 20, preferably over its entire length. Preferably, the thickness of the oxide is less than 100 Angstroms and more preferably less than 50 Angstroms. Over a portion of the oxide, another conductive thin-film, shown as metal 2 (preferably aluminum), is deposited and patterned to create two isolated control elements 26, a tunnel junction device with metal 1 and metal 2 as its electrodes. Metal 2 is also called a middle electrode 42 as it is formed electrically between the wordline 20 and the bitline 18. Disposed on metal 2 and portions of the oxide where the middle electrode 42 is not present is another layer of ILD 40. A via is etched in ILD 40 to locate the vertical pillar. A portion of the middle electrode 42 is preferably oxidized or oxide is deposited thereon to form the storage element 24. Finally, the tungsten is deposited to form the bitline 18 and it contacts the oxide to form the storage element 24 with the middle electrode 42 and the bitline 18 as the electrodes.

FIG. 15 is an alternative embodiment of dual memory cell 23 to that shown in FIG. 14 but which includes two angled storage elements 25 that surround at least two edges of middle electrode 42. By surrounding at least two edges of middle electrode 42 an enhanced electric field is formed at the intersection of the two edges. This enhanced electric field allows for lower programming power, voltage, current, or time when shorting an antifuse, such as with tunnel junction or dielectric breakdown devices used for angled storage element 25. In this embodiment, an ILD 40 is placed down on a surface adjacent and abutting the bit-line 18, preferably made of tungsten (W). When the bit-line 18 is deposited, it forms a contact surface over the angled storage element 25. By having an angled storage element, the electric field produced when a voltage is applied between the middle electrode 42 and the bit-line 18 is enhanced, thereby allowing for a lower programming voltage. Otherwise, the construction of the memory cell in FIG. 15 is similar to that described for FIG. 14.

FIG. 16 is another embodiment of the dual memory cell 23 in which the control elements 26 are formed of pn junction diodes. In this embodiment, an ILD 40 is placed on a surface and a first metal, such as aluminum, is deposited and patterned to create the wordline 20. A layer of n silicon 44 is then deposited over the wordline 20. A subsequent layer of p silicon 46 is then deposited over the n silicon 44. The combined silicon is then patterned and etched to create two control elements 26. An ILD 40 is then deposited or otherwise applied on the layer of p silicon 46. A via is etched in ILD 40 to locate the vertical bitline 18. The edges of the layer of p-silicon 46 that interfaces with the vertical bitlines 18 are oxidized to create a silicon dioxide layer for storage element 24 preferably less than 100 Angstroms in thickness and more preferably less than 50 angstroms in thickness. Vertical bitline 18 are then deposited. The storage elements 24 have the layers of p silicon 46 and the bitlines 18 as electrodes and the oxide layer as the anti-fusible material.

Figure 17:
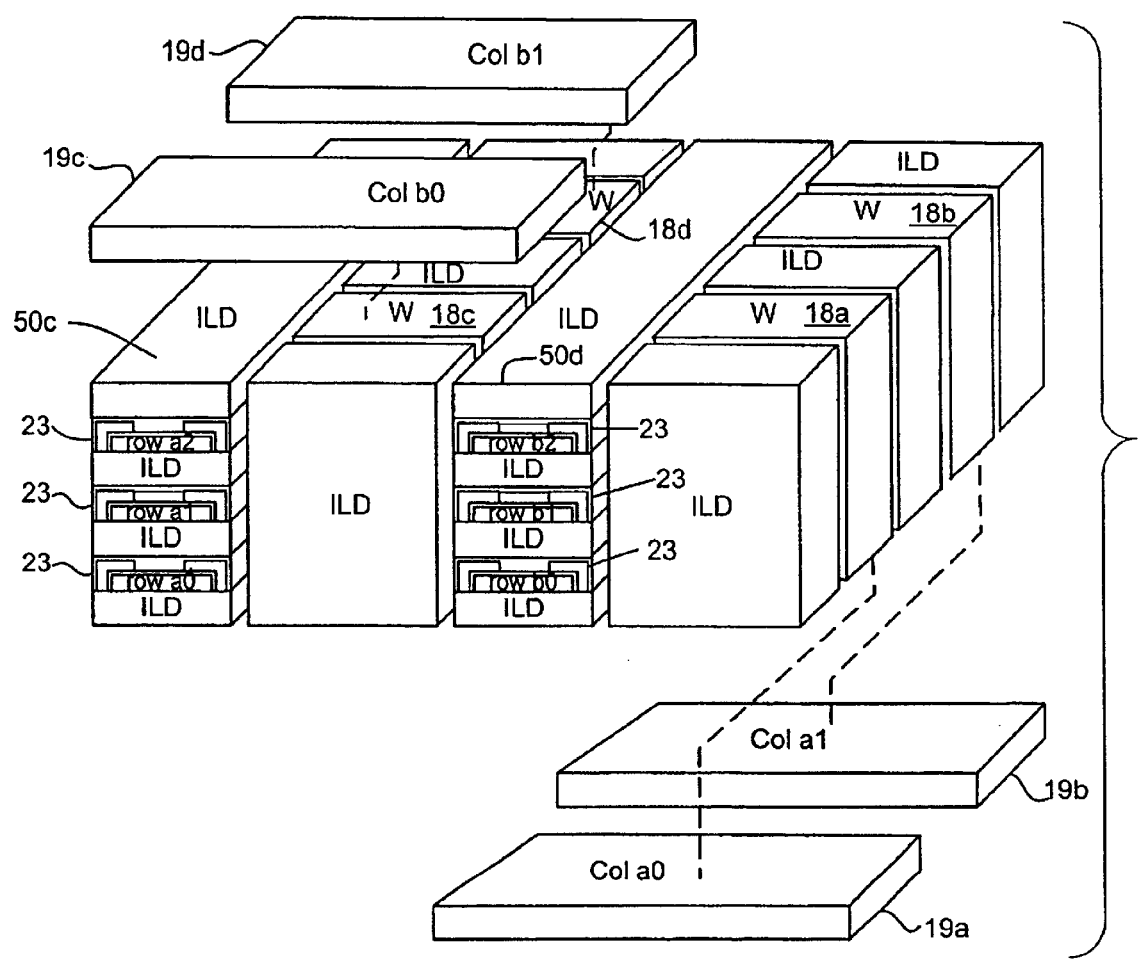
FIG. 17 is a partially exploded view of an exemplary memory array that incorporates the basic structure shown in FIG. 12.

FIG. 17 is a partially exploded view of an embodiment of a 3D memory array that incorporates the basic dual memory cell 23 shown in FIGS. 12–13. In this embodiment, horizontal bit-lines 19a and 19b are formed within a substrate surface that defines a plane. Sets of memory cells 50c–d that are formed in planes parallel to the plane of the substrate are disposed on the substrate. Vertical bit-lines 18a–18d are formed in planes that are perpendicular to the plane of the substrate. The vertical bit lines 18a–d are adjacent to and make contact with the storage elements in the respective adjacent set of memory cells 50c–d. Optionally, the cubic memory array can be extended by adding an ILD layer (not shown) on the set of memory cells and planarizing it to form a new substrate surface. On this planar surface, another set of horizontal bit-lines 19c and 19d are disposed and are connected by vias into the top ILD layer to the respective vertical pillars 18c and 18d. Further sets of memory cells and vertical bit-lines are then optionally built upon the additional substrate surface. Because there is no ILD separating a vertical bit line from adjacent sets of memory cells, each vertical bit line is in contact with two storage elements per horizontal layer.

Figure 18:
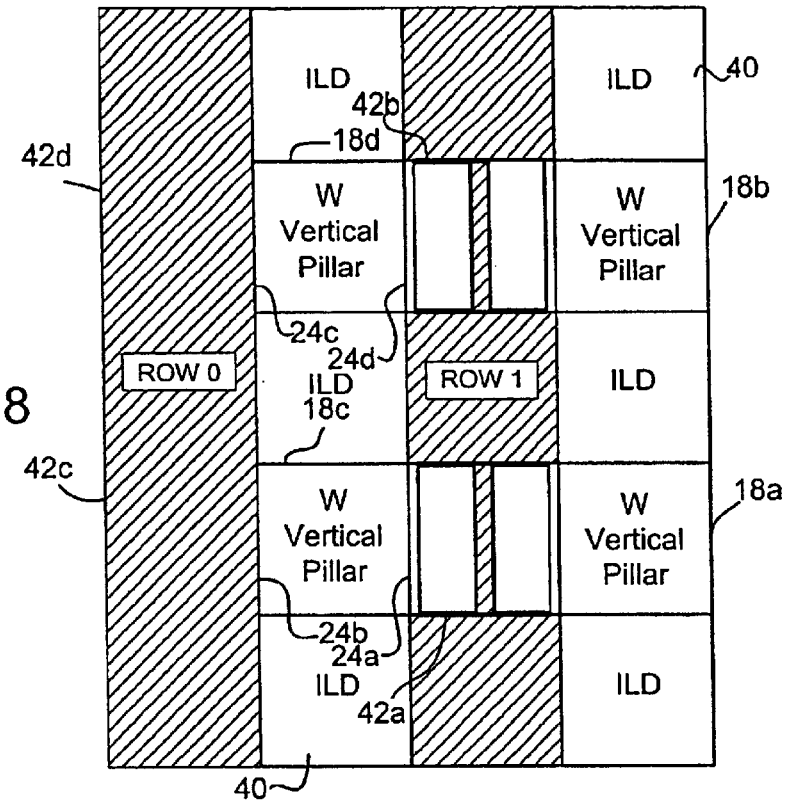
FIG. 18 is a top view of the embodiment shown in FIG. 17.

FIG. 18 is a top view of the embodiment of that shown in FIG. 17. In this embodiment, the middle electrodes 42c and 42d contact the vertical pillar bit-lines 18c and 18d, respectively, forming memory storage elements 24b and 24c. In addition, because there is no ILD 40 separating the next set of middle electrodes 42a and 42b from the vertical pillar bit-lines 18c and 18d, respectively a second set of memory storage elements 24a and 24d are formed.

Figure 19:
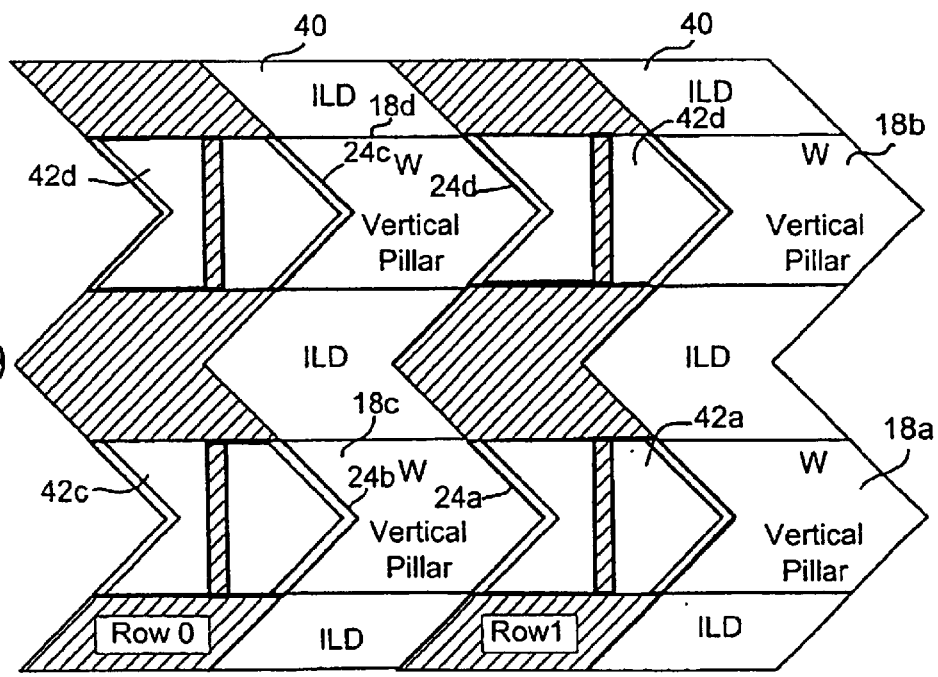
FIG. 19 is a top view of an alternative embodiment of the invention using a serpentine layout with respect to the basic structure shown in FIG. 18.

FIG. 19 is a top view of an alternative embodiment of that shown in FIG. 18 in which serpentine horizontal word-lines are used to enhance electric fields to lower the programming power, voltage, current and time of the memory cells that are actually programmed. By having two edges form a point or corner, the electric field is increased for a given voltage potential between the middle electrodes 42 (42a–42d) and the vertical pillar bit-lines 18 (18a–18d).

Figure 20:
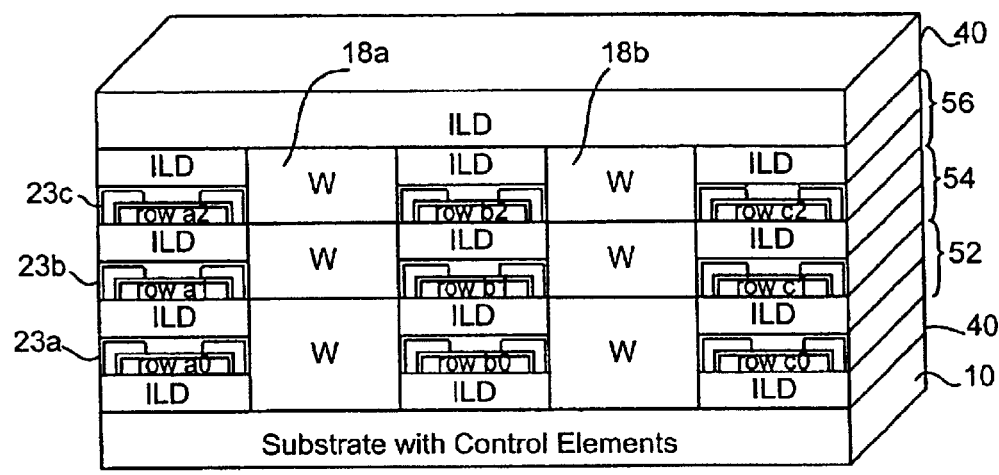
FIG. 20 is a perspective view of an alternative embodiment of the invention.
Figure 21:
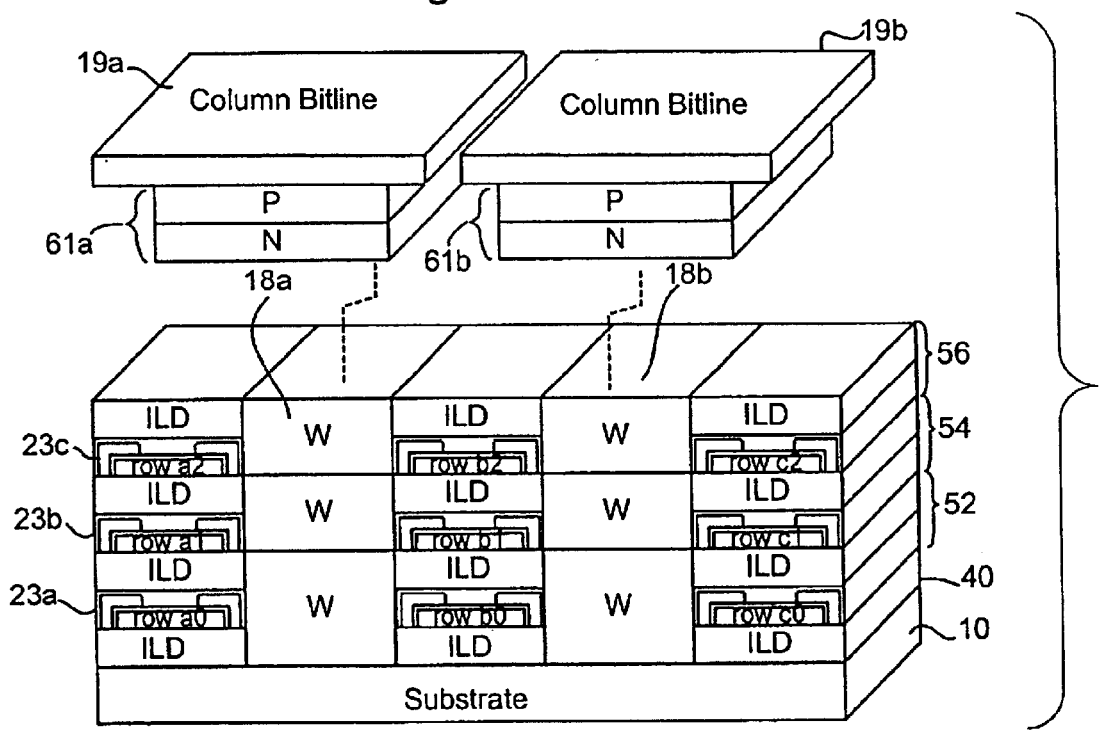
FIG. 21 is a partially exploded view of an alternative embodiment of the invention.
Figure 22:
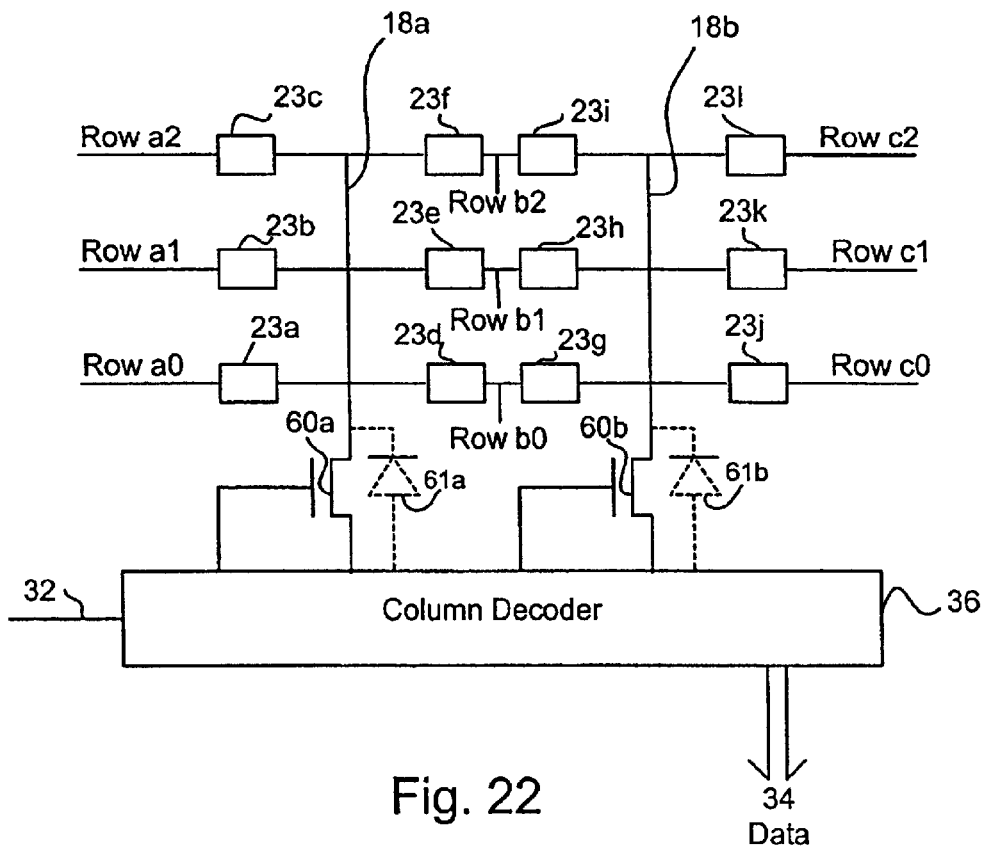
FIG. 22 is a partial schematic of an alternative embodiment using dual memory cells.

FIGS. 20 and 21 are perspective views of alternative embodiments of the invention. FIG. 22 is a partial schematic of the alternative embodiments shown in FIGS. 20 and 21. In the embodiment of FIG. 20, rather than routing the bit-lines select signals using horizontal bit-lines to the vertical pillar bit-lines 18a and 18b, the vertical pillar bit-lines 18a and 18b make contact with the substrate 10 directly to the control transistors 60a and 60b (FIG. 22), respectively. The control transistors are fabricated on the substrate using conventional semiconductor processing and can be implemented in various technologies, for example, a field effect transistors (FET). Alternatively, the control transistors can be replaced with other control elements such as diodes 61a and 61b. Preferably, the control transistors or diodes are disposed substantially beneath or adjacent to the vertical pillar bit-lines 18a–b. By having the sense transistors 60a, 60b (FIG. 22) or diodes 61a and 61b distributed beneath the vertical pillar bit-lines 18a, 18b respectively, increased sensing speed is achieved by reducing capacitive loading on the sense lines. Memory cells 23a, 23b, 23c are stacked upon one another in first level 52, second level 54, and third level 56, respectively. An ILD 40 is placed over the last level, third level 56 in this example, to act as a passivation layer or as a planar surface on which to build additional layers.

FIG. 21 is a partially exploded diagram of an alternative embodiment in which the cubic array is formed on a substrate that is not necessarily a semiconductor substrate. In this embodiment, the diodes 61a and 61b are formed after the vertical pillars 18a and 18b are formed. The diodes 61a and 61b are preferably formed using a ramped doped silicon deposition process. After the diodes 61a and 61b are formed, an ILD layer (not shown) is deposited between the diodes 61a and 61b before depositing the horizontal bitlines 19a and 19b. The diodes 61a and 61b may be electrically connected to one or more vertical pillars, thus allowing for shared diodes. Preferably, the diodes 61a and 61b are sized appropriately to provide adequate current during programming without causing failure.

FIG. 22 shows a partial schematic of the antifuse connection to the word-lines and bit-lines of the wordline 38 and column 36 decoders (see FIG. 1). Rows a0-2, b0-2, and c0-2 are outputs from the wordline decoder 38 (not shown, but see FIG. 1) and couple to dual memory cells 23a–23l. Vertical pillar bit-lines 18a, 18b connect to a switching element such as sense transistors 60a and 60b (or alternatively diodes 61a and 61b), respectively which are controlled and input into the column decoder 36. Based on the contents of the inputs of address lines 32 coupled into the column decoder 36, the sensed data is output on data bus 34.

Figure 23:
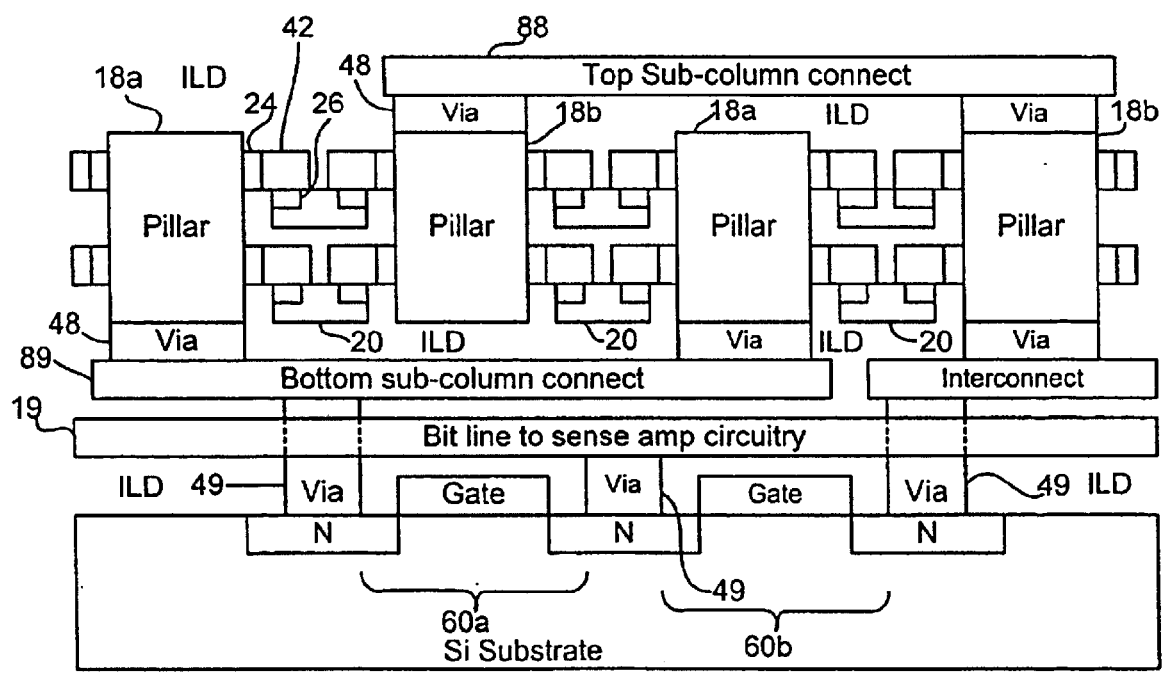
FIG. 23 is a side view of an exemplary embodiment of the invention.

FIG. 23 is a sectional view of an alternative embodiment of the invention in which the vertical pillar select lines 18a and 18b are formed in more than one pillar and interconnected by top sub-column connect 88 and bottom sub-column connect 89. The top 88 and bottom 89 sub-column drive connects couple to the vertical pillars 18a and 18b through vias 48. Because the vertical pillars 18a and 18b short the memory storage elements 24 on the respective sides of the pillar, only one storage element 24 per pillar can be accessed at one time. Therefore, every other pillar is connected to a sub-column connect line. Each memory cell has a storage element 24 in series with a control element 26 that are coupled in series through a middle electrode 42. The vertical pillar 18a or vertical pillar 18b are interconnected to a horizontal single bit line 19 that is connected to the sense amp circuitry in the column decoder 36 of FIG. 1. This interconnection is achieved by enabling one of transistors 60a or 60b to select the desired vertical pillar 18a and 18b.

Figure 24:
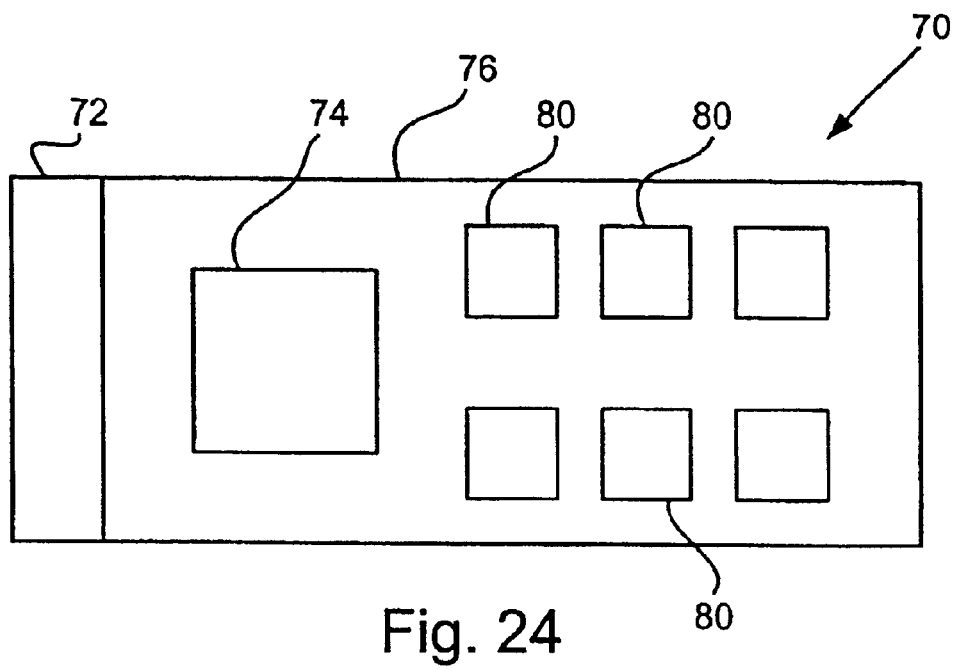
FIG. 24 is a exemplary layout of a memory carrier that incorporates at least one embodiment of the invention.

FIG. 24 is an exemplary layout of a memory carrier 70 that incorporates at least one embodiment of the invention. The memory carrier represents any of several conventional standard or proprietary memory card formats, such as a PCMCIA, PC card, Smart memory, memory stick, digital film, ATA, and compact flash to just name a few. The memory carrier includes a mechanical interface 72 that provides for both mechanical and electrical contact with a particular connector for the type of memory carrier standard implemented. An optional electrical interface 74 makes electrical coupling with the electrical contacts on the mechanical connector 72 and provides the proper security, address decoding, voltage translation, write protection, or other typical interface functions with a set of memory ICs 80 that incorporate at least one memory array of the invention. A carrier 76, for example a printed circuit board or ceramic substrate, typically is used to physically support the memory ICs 80, electrical interface 74, and mechanical interface 72. It will be appreciated to those of known skill in the art that some electrical devices might incorporate the functionality of electrical interface 74 thereby obviating its need in memory carrier 70. The set of memory ICs 80 may include one or more devices. Further, there may be more than one type of memory array, such as an OTP memory IC and read-writeable memory ICs for memory ICs 80.

Figure 25:
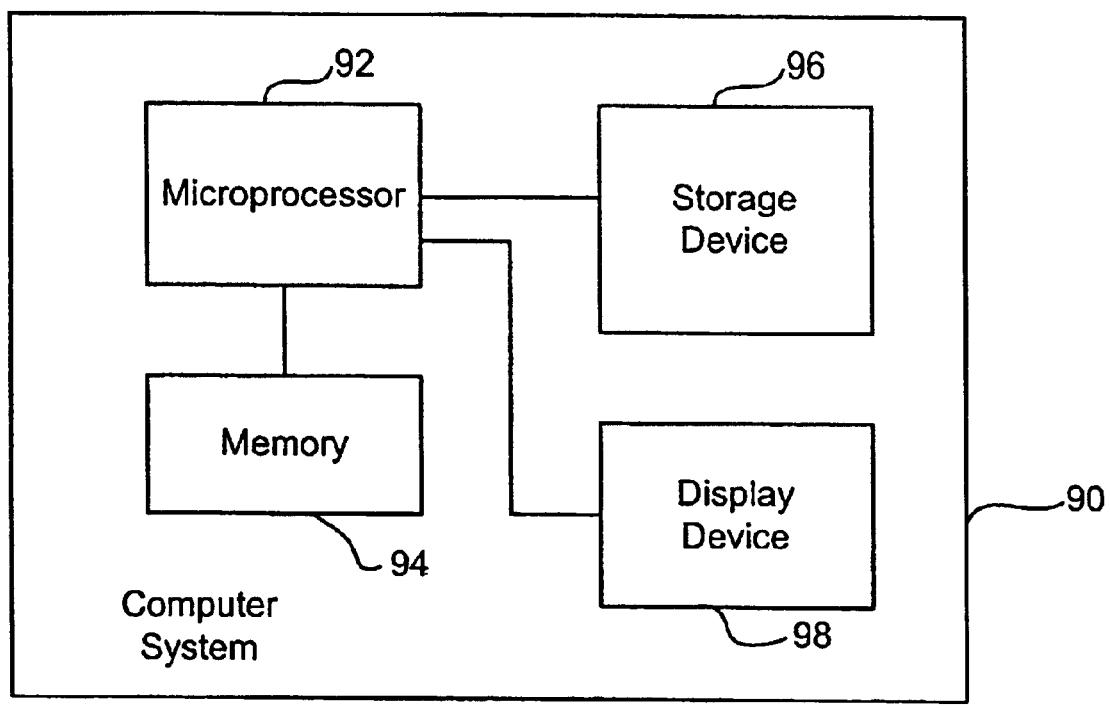
FIG. 25 is a block diagram of an electronic device, a computer system, which incorporates at least one embodiment of the invention.

FIG. 25 is a block diagram of an electronic device, in this example a computer system 90, which incorporates at least one embodiment of the invention. In particular for a computer system, several different electrical devices as shown may be incorporated into the package. Here a microprocessor 92 is coupled to a memory circuit 94 used to hold computer executable instructions and/or user data. Exemplary memory circuits 94 include BIOS memory, DRAM memory, ROM, and various levels of internal or external cache memory just to name a few. The microprocessor 92 is also connected to a storage device 96 such as a hard disk drive, floppy drive, CD/DVD drive, tape drive or other mass storage devices such as those that incorporate semiconductor memory ICs using the invention. The microprocessor 92 may include the 3D-memory architecture in its internal cache memory for instance. The memory 94 may also include the 3D-memory architecture in its memory ICs, such as in BIOS or other system memory areas such as DRAM and ROM circuits. The microprocessor 92 is further connected to a display device 98 that may also incorporate memory ICs that utilize the invention. Therefore, in an electrical device, there may one or more implementations of the invention, thus demonstrating the widespread applicability of the invention to improving existing electrical devices.

Figure 26:
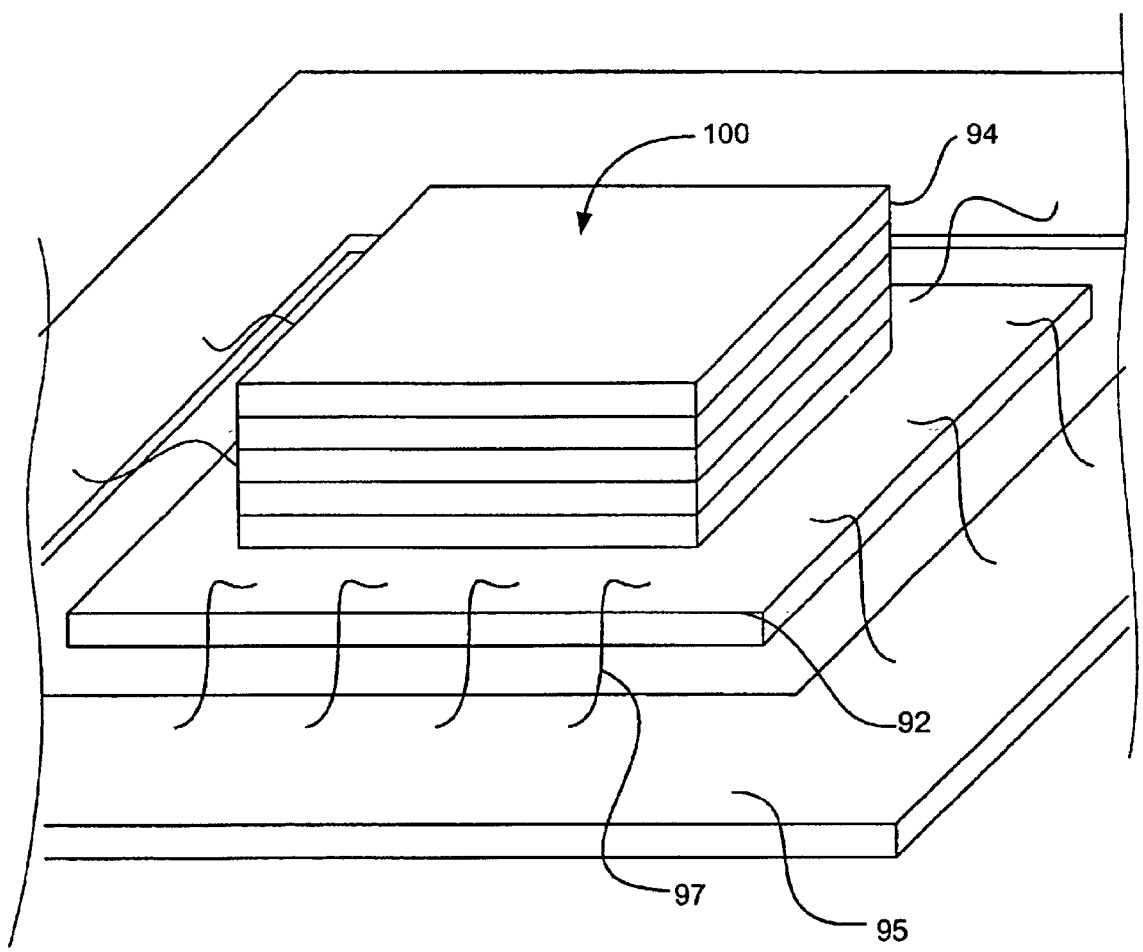
FIG. 26 is an exemplary partial perspective view of an embodiment of an embedded cubic memory array.

For instance, FIG. 26 is an exemplary embodiment of an embedded cubic memory array 100 that integrates the memory 94, such as level 1 and/or level 2 cache, with the microprocessor 92. The embedded cubic memory array 100 is fabricated on top of the die of microprocessor 92 thereby allowing for a smaller die area size. Microprocessor 92 forms a horizontal substrate surface. Preferably, memory 94 is built of one or more vertical layers of memory cells 22 or 23 (not shown) to form the embedded cubic memory array 100. The memory cells 22 or 23 are interconnected by a first and second set of select lines. At least one of the select lines is formed within the embedded cubic memory array 100 as vertical pillars. The sets of select lines are electrically connected to selection circuitry formed on the die of microprocessor 92. The microprocessor 92 is electrically attached to a package 95 such as with bonding wires 97 or TAB circuit technology. After the microprocessor is attached to package 95 it is encapsulated (not shown) to provide protection from contaminants and handling. Although the embedded cubic memory array 100 is shown as disposed on a microprocessor integrated circuit, those of skill in the art will appreciate that any integrated circuit that utilizes memory circuits can be substituted for the microprocessor 92. One example would be a graphics display controller.

Figure 27:
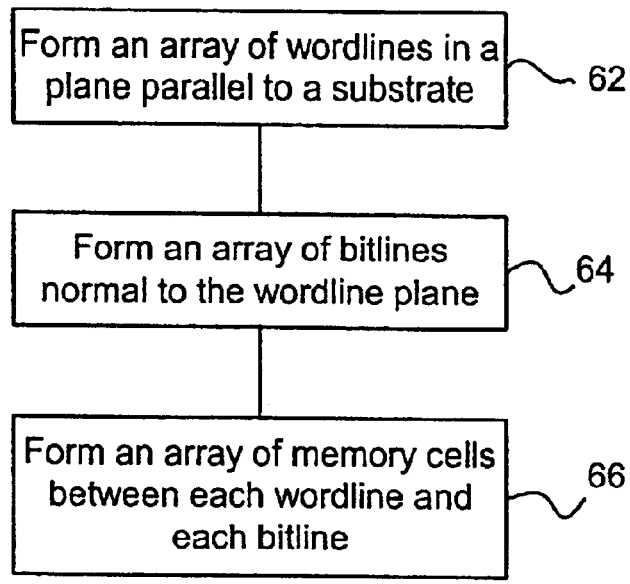
FIG. 27 is an exemplary flow chart of the basic steps used to implement embodiments of the invention.

FIG. 27 is an exemplary flow chart of the basic steps used to implement various embodiments of the invention. In step 62, an array of a set of word-lines is formed in a plane that is substantially parallel to a substrate or other planar surface. In step 64, an array of a set of bit-lines is formed substantially normal to the plane or word-lines or the substrate surface. By forming the bit-lines normal to the plane of the substrate and hence the word-lines, a set of vertical pillar bit-lines is created. In step 66, an array of memory cells is formed preferably between each respective wordline and each bitline, although some intersections of word-lines and bit-lines may not contain memory cells if those address locations are desired to be unprogrammable.

Figure 28:
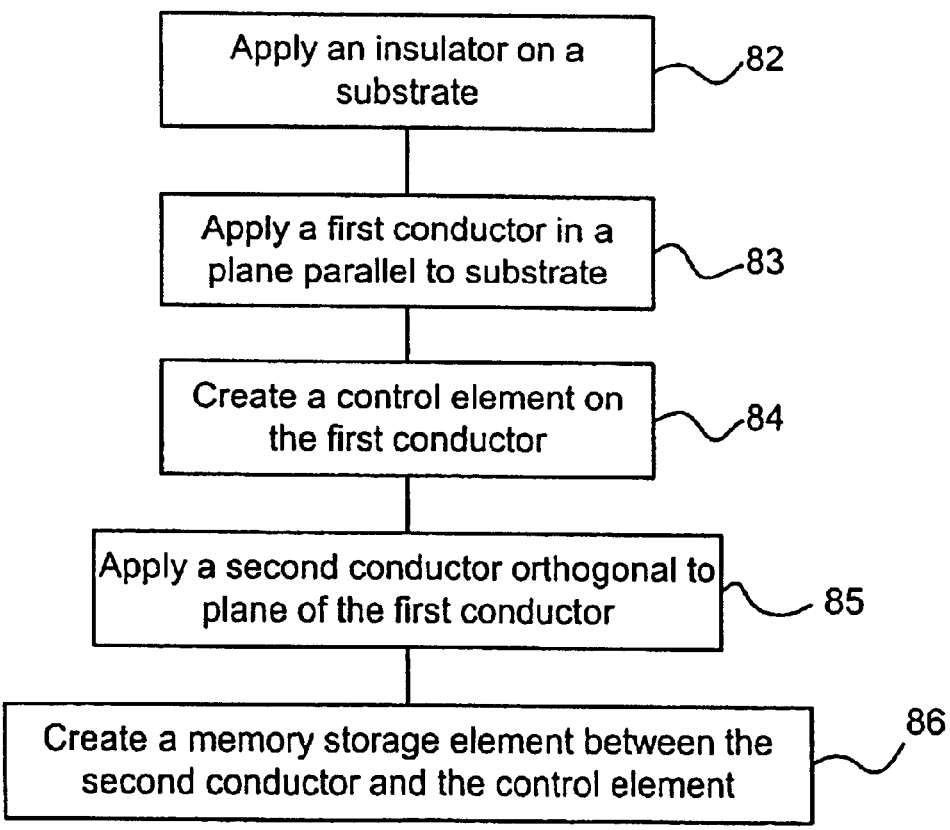
FIG. 28 is an exemplary flow chart for the basic steps to create a memory cell that incorporates the invention.

FIG. 28 is an exemplary flow chart for the basic steps to create a memory cell that incorporates the invention. In step 82 an insulator, such as ILD 40, is applied on a substrate surface, preferably substantially planar. In step 83, a first conductor is applied in a plane parallel to the substrate to form a wordline. In step 84, a control element is created on the first conductor, such as a tunnel junction device or a diode. In step 85, a second conductor that is orthogonal (normal or perpendicular) to the plane of the first conductor is applied to the processed substrate surface. In step 86, a memory storage element is created between the second conductor and the control element. The memory storage element is preferably a tunnel junction antifuse device but other memory storage elements can be used and still fall within the scope and spirit of the invention.

While the present invention has been particularly shown and described with reference to the foregoing preferred and alternative embodiments, those skilled in the art will understand that many variations may be made therein without departing from the spirit and scope of the invention as defined in the following claims. This description of the invention should be understood to include all novel and non-obvious combinations of elements described herein, and claims may be presented in this or a later application to any novel and non-obvious combination of these elements. The foregoing embodiments are illustrative, and no single feature or element is essential to all possible combinations that may be claimed in this or a later application. Where the claims recite "a" or "a first" element of the equivalent thereof, such claims should be understood to include incorporation of one or more such elements, neither requiring nor excluding two or more such elements.

What is claimed is:

1. A cubic memory array, comprising,
    a substrate;
    a plurality of levels of memory cells formed on the substrate one level upon the other, the memory cells of each level are substantially aligned with memory cells in the adjacent level;
    a plurality of sets of first select lines formed in each of the plurality of levels of memory cells substantially parallel to the substrate;
    a plurality of sets of second select lines formed in planes orthogonal to the substrate; and
    at least one switching element disposed on top of at least one of the plurality of second select lines
    wherein each of the memory cells is adjacent to a respective first and second select line.

2. The cubic memory array of claim 1, wherein at least one of the memory cells stores multiple states allowing for more than one bit of information in the memory cell.

3. The cubic memory array of claim 1, wherein at least one of the memory cells includes an antifuse device.

4. The cubic memory array of claim 1, wherein at least one of the memory cells includes a tunnel junction device.

5. The cubic memory array of claim 1, wherein at least one of the memory cells includes,
    a storage device having a first cross-sectional area;
    a control element in series with the storage device and having a second cross-sectional area greater than the first cross-sectional area.

6. The cubic memory array of claim 1, wherein the plurality of sets of second select lines are formed of tungsten.

7. The cubic memory array of claim 1, wherein at least one of the memory cells includes an angled storage element patterned to create an enhanced electric field.

8. The cubic memory array of claim 1, wherein at least one of the memory cells has dual storage elements and wherein only one storage element is used.

9. The cubic memory array of claim 1, wherein the plurality of sets of first select lines are formed in at least a partial serpentine pattern.

10. The cubic memory array of claim 1, where at least one of the plurality of sets of second select lines are formed from an array of sub-pillars connected by a subset of second select lines formed parallel to the substrate surface.

11. A cubic memory array, comprising:
    a substrate;
    a first plane of an array of memory cells disposed on the substrate;
    a first set of select lines forming rows of memory cells on the first plane;
    a second plane of an array of memory cells disposed on the first plane and aligned with the array of memory cells of the first plane;
    a second set of select lines orthogonal to the planer surface interconnecting the first and second planes of memory cells wherein each memory cell is adjacent to one of the first set of select lines and adjacent to one of the orthogonal second set of select lines; and
    at least one switching element disposed on top of one of the second set of select lines.

12. The cubic memory array of claim 11, wherein at least one of the memory cells stores multiple states allowing for more than one bit of information in the memory cell.

13. The cubic memory array of claim 11, wherein at least one of the memory cells includes an antifuse device.

14. The cubic memory array of claim 11, wherein at least one of the memory cells includes a tunnel junction device.

15. The cubic memory array of claim 11, wherein at least one of the memory cells includes,
a storage device having a first cross-sectional area;
a control element in series with the storage device and having a second cross-sectional area greater than the first cross-sectional area.

16. The cubic memory array of claim 11, wherein the second set of select lines are formed of tungsten.

17. The cubic memory array of claim 11, wherein at least one of the memory cells includes an angled storage element patterned to create an enhanced electric field.

18. The cubic memory array of claim 11, wherein at least one of the memory cells has dual storage elements and wherein only one storage element is used.

19. The cubic memory array of claim 11, wherein the first set of select lines are formed in at least a partial serpentine pattern.

20. The cubic memory array of claim 11, wherein at least one of the second set of select lines are formed from an array of sub-pillars connected by a subset of second select lines formed parallel to the substrate surface.

21. A cubic memory array, comprising:
a plurality of horizontal select lines;
a plurality of vertical select lines;
a plurality of memory cells, each memory cell adjacent to a horizontal select line and adjacent to a vertical select line; and
at least one switching element disposed on top of at least one of the plurality of vertical select lines;
wherein the plurality of memory cells are arranged to form planes of horizontal select lines and planes of vertical select lines orthogonal to each other.

22. The cubic memory array of claim 21, wherein at least one of the memory cells stores multiple states allowing for more than one bit of information in the memory cell.

23. The cubic memory array of claim 21, wherein at least one of the memory cells includes an antifuse device.

24. The cubic memory array of claim 21, wherein at least one of the memory cells includes a tunnel junction device.

25. The cubic memory array of claim 21, wherein at least one of the memory cells includes,
a storage device having a first cross-sectional area;
a control element in series with the storage device and having a second cross-sectional area greater than the first cross-sectional area.

26. The cubic memory array of claim 21, wherein the vertical select lines are formed of tungsten.

27. The cubic memory array of claim 21, wherein at least one of the memory cells includes an angled storage element patterned to create an enhanced electric field.

28. The cubic memory array of claim 21, wherein at least one of the memory cells has dual storage elements and wherein only one storage element is used.

29. The cubic memory array of claim 21, wherein the horizontal of select lines are formed in at least a partial serpentine pattern.

30. The cubic memory array of claim 21, where at least one of the vertical select lines are formed from an array of sub-pillars connected by a subset of second horizontal select lines.

31. A cubic memory array, comprising:
a substrate having a first surface
a horizontal line disposed parallel to first surface of the substrate;
an isolation layer formed on a portion of the horizontal bit line;
a vertical bit line formed next to the isolation layer and contacting the horizontal bit line;
a switching element disposed on top of the vertical bit line;
a first memory cell having,
a storage element adjacent to the vertical bit line,
a control element in series with the storage element, and
a first horizontal word line disposed on the isolation layer and contacting the control element; and
at least one additional memory cell having a second horizontal word line disposed on the first memory cell and contacting the vertical bit line.

32. The cubic memory array of claim 31, wherein at least one of the storage elements stores multiple states allowing for more than one bit of information in the storage element.

33. The cubic memory array of claim 31, wherein at least one of the storage elements is an antifuse device.

34. The cubic memory array of claim 31, wherein at least one of the storage cells is a tunnel junction device.

35. The cubic memory array of claim 31, wherein
the storage device has a first cross-sectional area;
the control element has a second cross-sectional area greater than the first cross-sectional area.

36. The cubic memory array of claim 31, wherein the vertical bit line comprises tungsten.

37. The cubic memory array of claim 31, wherein the storage element comprises an angled storage element patterned to create an enhanced electric field.

38. The cubic memory array of claim 31, wherein the memory cells has an additional storage element and wherein the additional storage element is not used to store information.

39. The cubic memory array of claim 31, wherein the horizontal bit line is formed in at least a partial serpentine pattern.

40. The cubic memory array of claim 31, where the vertical bit line is formed from an array of sub-pillars connected by a subset of second horizontal bit lines.

41. A cubic memory array, comprising:
a plurality of horizontal word lines formed in a plurality of layers;
a plurality stacked memory cells, each memory cell disposed on one of the plurality of horizontal word lines;
a plurality of horizontal too sub-column connects;
a plurality of horizontal bottom sub-column connects;
a plurality of vertical bit lines contacting the plurality of stacked memory cells, wherein the vertical bit lines are formed in more than one pillar and are interconnected by one of the plurality of too sub-column connects and one of the plurality of bottom sub-column connects, wherein the every other pillar is connected to one of a too sub-column connect or a bottom sub-column connect.

42. The cubic memory array of claim 41, wherein at least one of the stacked memory cells includes a storage element that stores multiple states allowing for more than one bit of information in the storage element.

43. The cubic memory array of claim 41, wherein at least one of the stacked memory cells comprises an antifuse device.

44. The cubic memory array of claim 41, wherein at least one of the stacked memory cells comprises a tunnel junction device.

45. The cubic memory array of claim 41, wherein at least one of the stacked memory cells comprises,
a storage device having a first cross-sectional area;
a control element having a second cross-sectional area greater than the first cross-sectional area.

46. The cubic memory array of claim 41, wherein at least one of the plurality of vertical bit lines comprises tungsten.

47. The cubic memory array of claim 41, wherein at least one of the stacked memory storage cells comprises an angled storage element patterned to create an enhanced electric field.

48. The cubic memory array of claim 41, wherein the stacked memory cells has an additional storage element and wherein the additional storage element is not used.

49. The cubic memory array of claim 41, wherein one of the plurality of horizontal word lines is formed in at least a partial serpentine pattern.

50. A cubic memory array, comprising
control circuitry;
a first horizontal select line;
a first set of memory cells adjacent to the first horizontal select line;
a first set of vertical select lines intersecting with the first set of memory cells;
a second horizontal select line isolated from the first set of memory cells;
a second set of memory cells adjacent to the second horizontal select line;
a second set of vertical select lines intersecting with the second set of memory cells;
switching elements disposed on top of the vertical select lines;
a set of horizontal bitlines connecting the switching elements to the control circuitry;
a third horizontal select line isolated from and stacked upon the first horizontal select line;
a third set of memory cells adjacent to the third horizontal select line;
a fourth horizontal select line isolated from and stacked upon the second horizontal select line; and
a forth set of memory cells adjacent to the fourth horizontal select line;
wherein the first set of vertical select lines intersect with the third set of memory cells, and the second set of vertical select lines intersect with the fourth set of memory cells.

51. The cubic memory array of claim 50, wherein at least one of the memory cells includes a storage element that stores multiple states allowing for more than one bit of information in the storage element.

52. The cubic memory array of claim 50, wherein at least one of the memory cells comprises an antifuse device.

53. The cubic memory array of claim 50, wherein at least one of the memory cells comprises a tunnel junction device.

54. The cubic memory array of claim 50, wherein at least one of the memory cells comprises,
a storage device having a first cross-sectional area;
a control element having a second cross-sectional area greater than the first cross-sectional area.

55. The cubic memory array of claim 50, wherein at least one of the vertical select lines comprises tungsten.

56. The cubic memory array of claim 50, wherein at least one of the memory storage cells comprises an angled storage element patterned to create an enhanced electric field.

57. The cubic memory array of claim 50, wherein the memory cells has an additional storage element and wherein the additional storage element is not used.

58. A cubic memory array, comprising:
a substrate;
a set of horizontal word lines formed parallel to the substrate in a plurality of layers;
a set of top sub-column connects;
a set of bottom sub-column connects, the top and bottom sub-column connects parallel to the substrate and orthogonal to the set of horizontal word lines;
a set of vertical bitlines wherein the vertical bit lines are formed in more than one pillar and are interconnected by one of the set of top sub-column connects and one of the set of bottom sub-column connects;
wherein the every other pillar is connected to one of a top sub-column connect or a bottom sub-column connect; and
a set of memory cells, each memory cell having,
a storage element adjacent to a pillar,
a control element in series with the storage element connected to a horizontal word line.

59. The cubic array of claim 58, further comprising:
control circuitry having switching elements formed in the substrate;
a set of horizontal bit lines, each interconnected to every other pillar using the switching elements to select a desired pillar.

60. The cubic memory array of claim 58, wherein at least one of the storage elements stores multiple states allowing for more than one bit of information in the storage element.

61. The cubic memory array of claim 58, wherein at least one of the storage elements is an antifuse device.

62. The cubic memory array of claim 58, wherein at least one of the storage cells is a tunnel junction device.

63. The cubic memory array of claim 58, wherein
the storage device has a first cross-sectional area;
the control element has a second cross-sectional area greater than the first cross-sectional area.

64. The cubic memory array of claim 58, wherein the vertical bit line comprises tungsten.

65. The cubic memory array of claim 58, wherein the storage element comprises an angled storage element patterned to create an enhanced electric field.

66. The cubic memory array of claim 58, wherein the memory cells has an additional storage element and wherein the additional storage element is not used to store information.

67. The cubic memory array of claim 58, wherein the horizontal word line is formed in at least a partial serpentine pattern.

* * * * *

UNITED STATES PATENT AND TRADEMARK OFFICE
CERTIFICATE OF CORRECTION

PATENT NO. : 6,781,858 B2
DATED : August 24, 2004
INVENTOR(S) : Fricke et al.

It is certified that error appears in the above-identified patent and that said Letters Patent is hereby corrected as shown below:

Column 17,
Line 65, delete "surface" and insert therefor -- surface; --.

Column 18,
Lines 48, 53 and 56, delete "too" and insert therefor -- top --.

Signed and Sealed this

Fifth Day of April, 2005

JON W. DUDAS
*Director of the United States Patent and Trademark Office*